US012782816B2

(12) United States Patent
Chen

(10) Patent No.: US 12,782,816 B2
(45) Date of Patent: Nov. 3, 2026

(54) UNDERLAYER COMPOSITION AND METHOD OF MANUFACTURING A SEMICONDUCTOR DEVICE

(71) Applicant: Taiwan Semiconductor Manufacturing Company, Ltd., Hsinchu (TW)

(72) Inventor: Chien-Chih Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

(21) Appl. No.: 18/776,675

(22) Filed: Jul. 18, 2024

(65) Prior Publication Data

US 2024/0369932 A1 Nov. 7, 2024

Related U.S. Application Data

(62) Division of application No. 17/231,402, filed on Apr. 15, 2021, now Pat. No. 12,099,301.

(Continued)

(51) Int. Cl.

*G03F 7/004* (2006.01)
*G03F 7/11* (2006.01)

(Continued)

(52) U.S. Cl.

CPC .............. *G03F 7/11* (2013.01); *G03F 7/0045* (2013.01); *H10P 76/2041* (2026.01); *G03F 7/0042* (2013.01); *G03F 7/2004* (2013.01)

(58) Field of Classification Search

CPC ........ G03F 7/0045; G03F 7/11; G03F 7/0042; G03F 7/004; H01L 21/0274; H10P 76/2041

See application file for complete search history.

(56) References Cited

U.S. PATENT DOCUMENTS 6,319,654 B1 11/2001 Kim et al.
8,796,666 B1 8/2014 Huang et al.

(Continued)

FOREIGN PATENT DOCUMENTS

CN 1228098 A 9/1999
CN 1310731 A 8/2001

(Continued)

OTHER PUBLICATIONS

Wang et al., "Photobase generator and photo decomposable quencher for high-resolution photoresist applications", Proceedings of SPIE, 2010, pp. 76390W-1-76390W-15, vol. 7639. (Year: 2010).*

(Continued)

*Primary Examiner* — Keith Walker
*Assistant Examiner* — Alexander N. Lee
(74) *Attorney, Agent, or Firm* — STUDEBAKER BRACKETT PLLC

(57) ABSTRACT

A method of manufacturing a semiconductor device includes forming a photoresist underlayer over a semiconductor substrate. The photoresist underlayer includes a polymer, including a main polymer chain having pendant target groups, and pendant organic groups or photoacid generator groups. The main polymer chain is a polystyrene, a polyhydroxystyrene, a polyacrylate, a polymethylacrylate, a polymethylmethacrylate, a polyacrylic acid, a polyvinyl ester, a polymaleic ester, a poly(methacrylonitrile), or a poly(methacrylamide). Pendant target groups are selected from the group consisting of a substituted or unsubstituted: C2-C30 diol group, C1-C30 aldehyde group, and C3-C30 ketone group. Pendant organic groups are C3-C30 aliphatic or aromatic groups having at least one photosensitive functional group, and pendant photoacid generator groups are C3-C50 substituted aliphatic or aromatic groups. A photoresist layer is formed over the photoresist underlayer. The (Continued)

photoresist layer is selectively exposed to actinic radiation. The selectively exposed photoresist layer is developed to form a photoresist pattern.

20 Claims, 25 Drawing Sheets

Related U.S. Application Data

(60) Provisional application No. 63/028,648, filed on May 22, 2020.

(51) Int. Cl.
*H10P 76/20* (2026.01)
*G03F 7/20* (2006.01)

(56) References Cited

U.S. PATENT DOCUMENTS

| | | | |
|---|---|---|---|
| 9,093,530 B2 | 7/2015 | Huang et al. | |
| 9,213,234 B2 | 12/2015 | Chang | |
| 9,223,220 B2 | 12/2015 | Chang | |
| 9,256,133 B2 | 2/2016 | Chang | |
| 9,310,684 B2 | 4/2016 | Meyers et al. | |
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 9,891,522 B2 | 2/2018 | Cheng et al. | |
| 2004/0063030 A1 | 4/2004 | Barr et al. | |
| 2008/0220381 A1* | 9/2008 | Hatakeyama | G03F 7/091 430/326 |
| 2009/0176177 A1 | 7/2009 | Han et al. | |
| 2010/0178617 A1* | 7/2010 | Hatakeyama | G03F 7/0397 430/323 |
| 2010/0233635 A1* | 9/2010 | Shimizu | G03F 7/265 252/182.3 |
| 2012/0088369 A1 | 4/2012 | Weidman et al. | |
| 2013/0177848 A1* | 7/2013 | Kanto | G03F 7/039 430/326 |
| 2015/0184018 A1* | 7/2015 | Endo | G03F 7/038 524/594 |
| 2015/0309403 A1 | 10/2015 | Rahman et al. | |
| 2016/0363866 A1* | 12/2016 | Hatakeyama | G03F 7/32 |
| 2017/0205709 A1* | 7/2017 | Hatakeyama | C07C 69/635 |
| 2019/0310551 A1 | 10/2019 | Minegishi et al. | |

FOREIGN PATENT DOCUMENTS

| | | | |
|---|---|---|---|
| CN | 1514302 | A | 7/2004 |
| JP | 2014-157252 | A | 8/2014 |
| KR | 2000-0073111 | A | 12/2000 |
| TW | 201641608 | A | 12/2016 |
| TW | 201702744 | A | 1/2017 |
| TW | 201825505 | A | 7/2018 |
| WO | 2019/217749 | A1 | 11/2019 |

OTHER PUBLICATIONS

Non-Final Office Action issued in U.S. Appl. No. 17/231,402, dated Nov. 22, 2023.

Notice of Allowance issued in U.S. Appl. No. 17/231,402, dated May 23, 2024.

* cited by examiner

TPS-Tf

DMPS-Tf

TPS-Nf

TPS-F4

$CF_3SO_3^-$

DPI-Tf $CF_3SO_3^-$

TBI-Tf $C_4F_9SO_3^-$

DPI-Nf $C_4F_9SO_3^-$

TBI-Nf

ND-Nf

UNDERLAYER COMPOSITION AND METHOD OF MANUFACTURING A SEMICONDUCTOR DEVICE

CROSS-REFERENCE TO RELATED APPLICATION

This application is a Divisional application of U.S. application Ser. No. 17/231,402, filed on Apr. 15, 2021, which claims priority to U.S. Provisional Patent Application No. 63/028,648, filed May 22, 2020, the entire disclosures of which are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as “beneath,” “below,” “lower,” “above,” “upper” and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Extreme ultraviolet (EUV) lithography to achieve sub-20 nm half-pitch resolution is under development for mass production for next generation sub 5 nm node. EUV lithography requires a high performance photoresist with high sensitivity for cost reduction of the high-power exposure source, and to provide good resolution of the image. Metallic resists have been developed that provide high sensitivity and good resolution. However, pattern collapse and increased line width roughness and line edge roughness may occur. Embodiments of this disclosure provide improved integrity of the photoresist pattern and decreased line width roughness, line edge roughness, and scum reduction. Embodiments of the disclosure allow reduced exposure doses.

Figure 1:
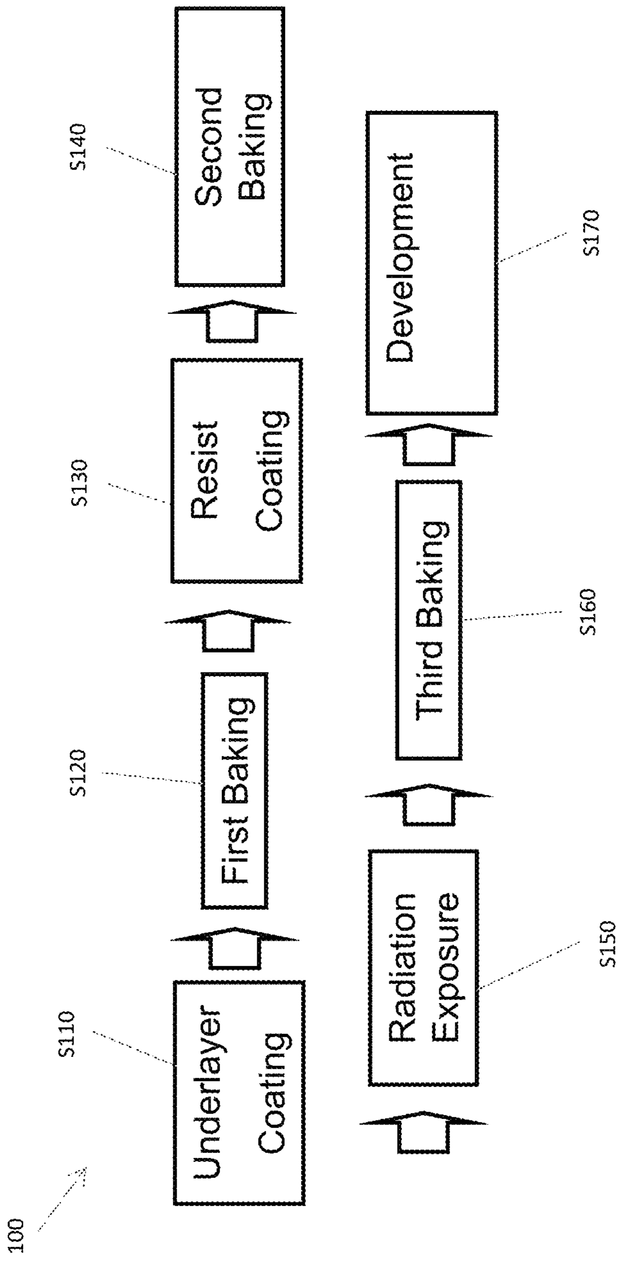
FIG. 1 illustrates a process flow of manufacturing a semiconductor device according to embodiments of the disclosure.
Figure 2:
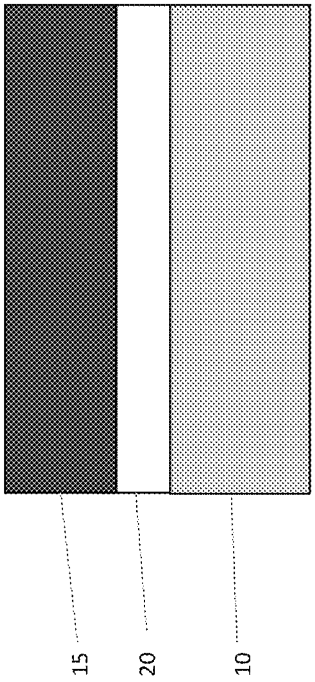
FIG. 2 shows a process stage of a sequential operation according to an embodiment of the disclosure.

FIG. 1 illustrates a process flow 100 of manufacturing a semiconductor device according to embodiments of the disclosure. A resist underlayer composition is coated on a surface of a layer to be patterned (target layer) or a substrate 10 in operation S110, in some embodiments, to form a resist underlayer 20, as shown in FIG. 2. In some embodiments, the resist underlayer 20 has a thickness ranging from about 2 nm to about 300 nm. In some embodiments, the resist underlayer has a thickness ranging from about 20 nm to about 100 nm. Then the resist underlayer 20 undergoes a first baking operation S120 to evaporate solvents in the underlayer composition in some embodiments. The underlayer 20 is baked at a temperature and time sufficient to cure and dry the underlayer 20. In some embodiments, the underlayer is heated at a temperature in a range of about 80° C. to about 300° C. for about 10 seconds to about 10 minutes. In some embodiments, the underlayer is heated at a temperature ranging from about 160° C. to about 250° C.

A resist layer composition is subsequently coated on a surface of the resist underlayer 20 in operation S130, in some embodiments, to form a resist layer 15, as shown in FIG. 2. In some embodiments, the resist layer 15 is a photoresist layer. Then the resist layer 15 undergoes a second baking operation S140 (or pre-exposure baking operation) to evaporate solvents in the resist composition in some embodiments. The resist layer 15 is baked at a temperature and time sufficient to cure and dry the photoresist layer 15. In some embodiments, the resist layer is heated at a temperature of about 40° C. to 150° C. for about 10 seconds to about 10 minutes. In some embodiments, the resist layer composition is coated on the resist underlayer 20 prior to baking the resist underlayer 20, and the resist layer 15 and resist underlayer 20 are baked together in a single baking operation to drive off solvents of both layers.

After the second (or pre-exposure) baking operation S140 of the photoresist layer 15, the photoresist layer 15 is selectively exposed to actinic radiation 45/97 (see FIGS. 3A and 3B) in operation S150. In some embodiments, the photoresist layer 15 is selectively exposed to ultraviolet radiation. In some embodiments, the radiation is electromagnetic radiation, such as g-line (wavelength of about 436 nm), i-line (wavelength of about 365 nm), ultraviolet radiation, deep ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

Figure 3A:
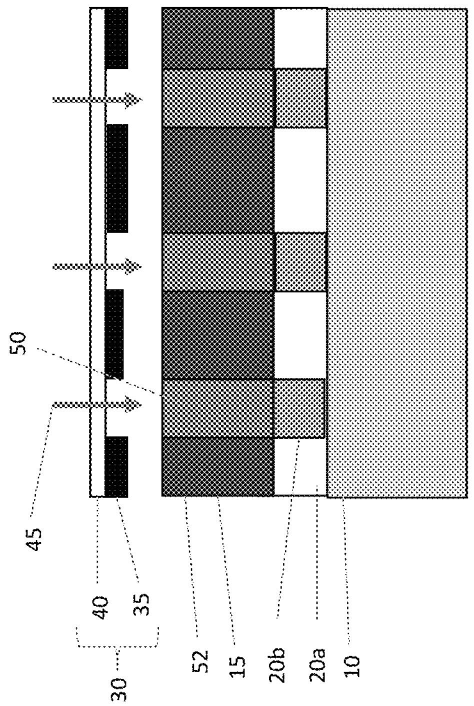
FIGS. 3A and 3B show a process stage of a sequential operation according to embodiments of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
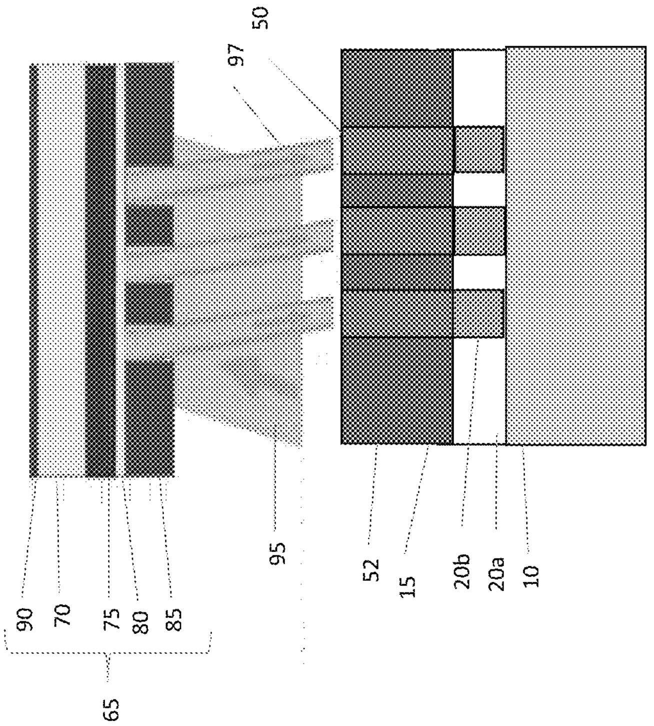

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion glass substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

The region of the photoresist layer exposed to radiation 50 undergoes a chemical reaction thereby changing its solubility in a subsequently applied developer relative to the region of the photoresist layer not exposed to radiation 52. In some embodiments, the portion of the photoresist layer exposed to radiation 50 undergoes a crosslinking reaction. In addition to causing the chemical reaction in the photoresist layer 15, a portion of the radiation 45/97 also passes through the photoresist layer 15 and causes a reaction in the resist underlayer 20. The reaction in the resist underlayer 20 results in a small molecule being generated, which subsequently diffuses into the photoresist layer 15. FIGS. 3A and 3B show exposed portions 20*b* and non-exposed portions 20*a* of the resist underlayer 20.

Next, the photoresist layer 15 and the resist underlayer 20 undergoes a third baking (or post-exposure bake (PEB)) in operation S160. In some embodiments, the photoresist layer 15 is heated at a temperature of about 50° C. to 200° C. for about 20 seconds to about 120 seconds. The post-exposure baking may be used to assist in the generating, dispersing, and reacting of the acid/base/free radical generated from the impingement of the radiation 45/97 upon the photoresist layer 15 during the exposure, and to assist in the diffusion of the small molecule from the exposed portion 20*b* of the resist underlayer 20 into the photoresist layer 15. Such assistance helps to create or enhance chemical reactions, which generate chemical differences between the exposed region 50 and the unexposed region 52 within the photoresist layer.

Figure 4:
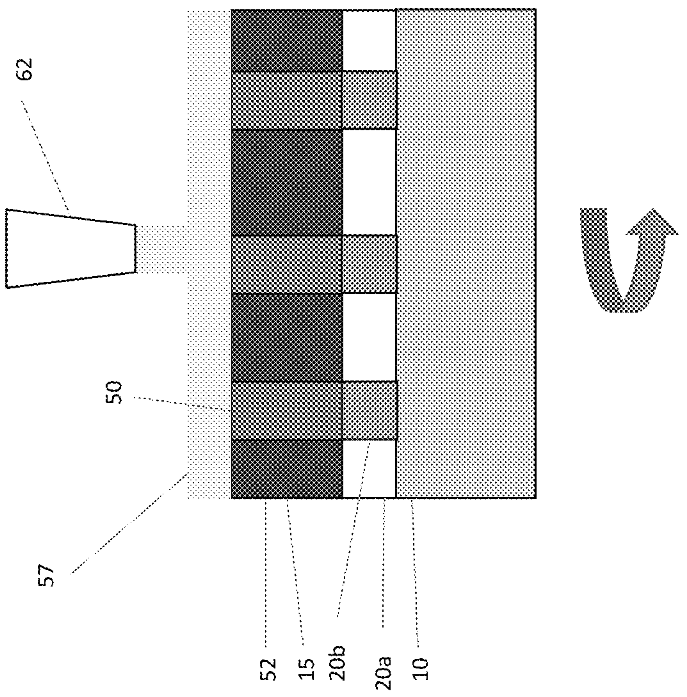
FIG. 4 shows a process stage of a sequential operation according to an embodiment of the disclosure.
Figure 5:
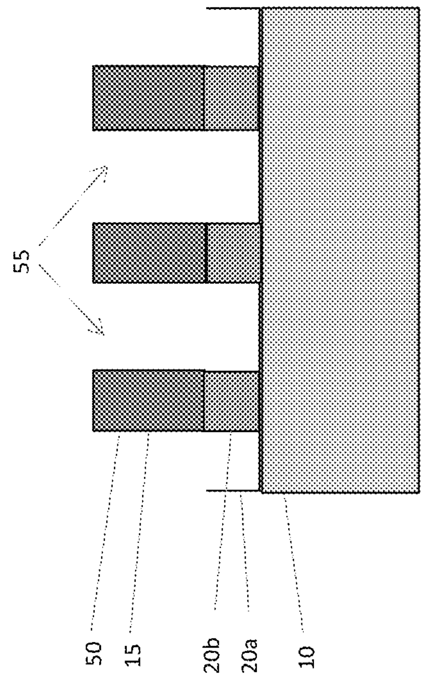
FIG. 5 shows a process stage of a sequential operation according to an embodiment of the disclosure.

The selectively exposed photoresist layer is subsequently developed by applying a developer to the selectively exposed photoresist layer in operation S170. As shown in FIG. 4, a developer 57 is supplied from a dispenser 62 to the photoresist layer 15. In some embodiments, the unexposed region 52 of the photoresist layer is removed by the developer 57 forming a pattern of openings 55 in the photoresist layer 15 to expose the underlayer 20*a*, as shown in FIG. 5.

Figure 6:
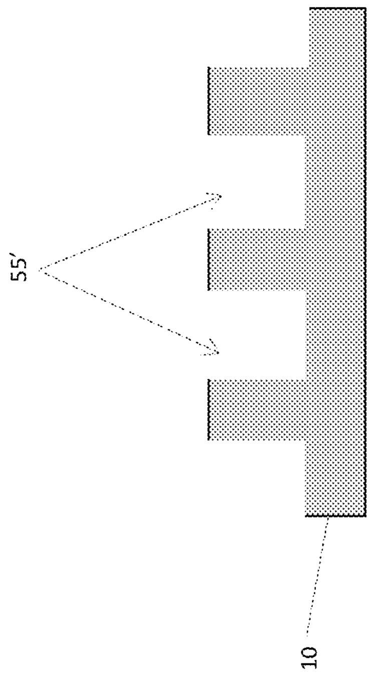
FIG. 6 shows a process stage of a sequential operation according to an embodiment of the disclosure.

In some embodiments, the pattern of openings 55 in the photoresist layer 15 is extended through the underlayer 20 into the substrate 10 to create a pattern of openings 55' in the substrate 10, thereby transferring the pattern in the photoresist layer 15 into the substrate 10, as shown in FIG. 6. The pattern is extended into the substrate by etching, using one or more suitable etchants. In some embodiments, the etching operation removes the portions of the underlayer 20*a* between the photoresist pattern features 50. The photoresist layer pattern 50 is at least partially removed during the etching operation in some embodiments. In other embodiments, the photoresist layer pattern 50 and the exposed portion of the underlayer 20*b* under the photoresist layer pattern are removed after etching the substrate 10 by using a suitable photoresist stripper solvent or by a photoresist ashing operation.

In some embodiments, the substrate 10 includes a single crystalline semiconductor layer on at least it surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

In some embodiments, the resist underlayer 20 improves the adhesion of the resist layer 15 to the substrate. In some embodiments, the resist underlayer 20 functions as a bottom anti-reflective coating (BARC). The BARC absorbs actinic radiation that passes through the photoresist layer, thereby preventing the actinic radiation from reflecting off the substrate or a target layer and exposing unintended portions of the photoresist layer. Thus, the BARC improves line width roughness and line edge roughness of the photoresist pattern.

Figure 7:
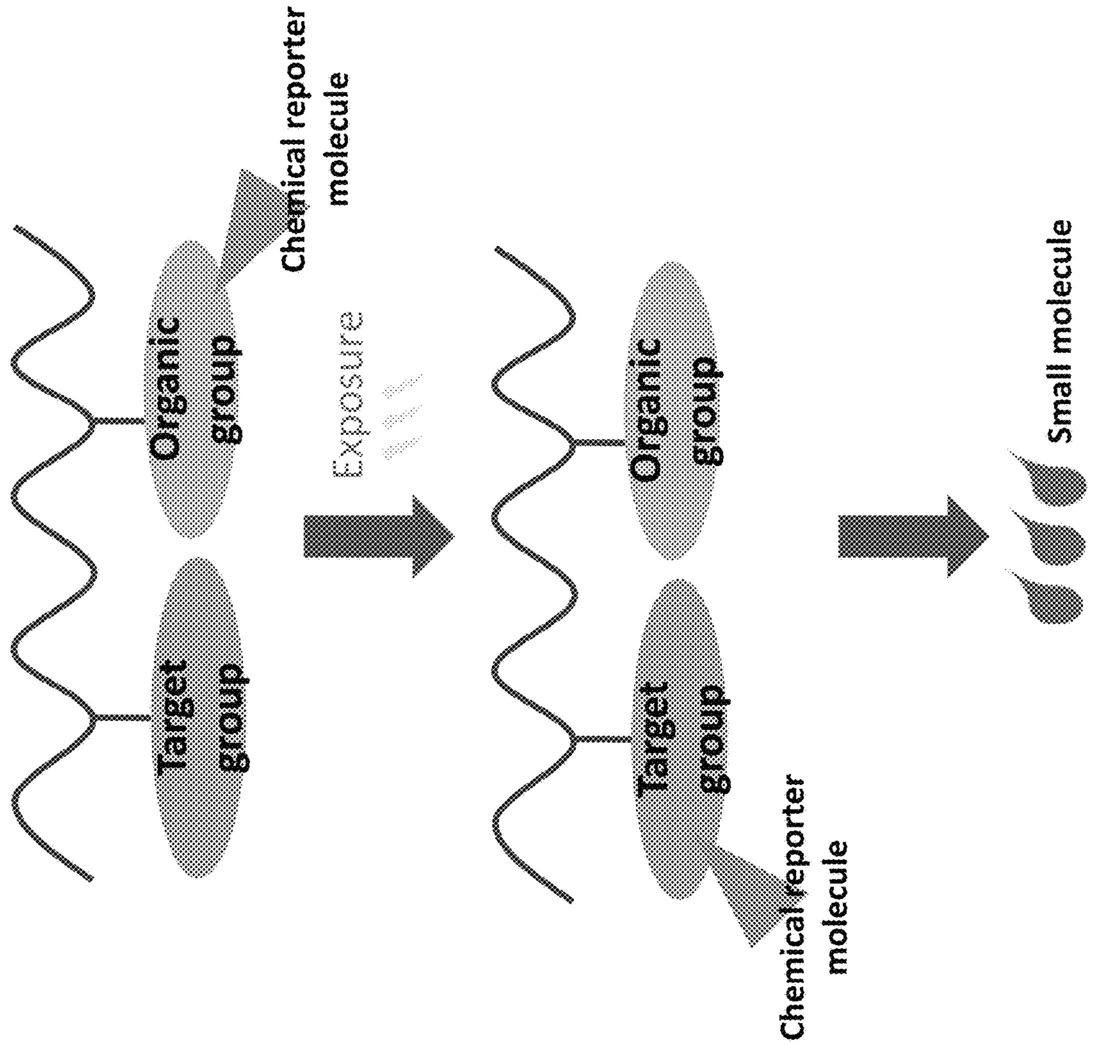
FIG. 7 illustrates a chemical reaction an underlayer material undergoes when irradiated with actinic radiation according to embodiments of the disclosure.

The resist underlayer 20 is made of polymer compositions, wherein the polymer has pendant target groups. In some embodiments, the polymer has one or more pendant target groups and a pendant organic group. In some embodiments, the pendant organic group includes a photosensitive functional group including a chemical reporter molecule, as shown in FIG. 7. In some embodiments, the polymer is a stimuli-responsive polymer. Stimuli-responsive polymers are polymers that are sensitive to certain external stimuli, and are capable of altering their chemical or physical properties upon exposure to the external stimuli.

In some embodiments, the pendant organic group are aromatic groups, photoacid generators (PAGs), and other sensitizers. In some embodiments, a photosensitive compound is included in the polymer composition, such as a PAG or a photobase generator (PBG). After exposure to actinic radiation, the photosensitive functional group or photosensitive compound releases chemical reporter molecules and the chemical reporter transfers from the photosensitive functional group or photosensitive compound to the target group. The target groups release desired small molecules when receiving the chemical reporter molecules, as shown in FIG. 7. The small molecules subsequently diffuse to the photoresist layer 15 by heating the resist underlayer 20 and the photoresist layer 15, where the small molecules advance chemical reactions such as hydrolysis, condensation, nucleophilic addition, and acid-base reactions.

In some embodiments, the chemical reporter molecules include an electron, an anion, a cation, $H^+$, $O_2$, $H_2O$, $NH_3$, HF, HCl, ROH, or $RNH_2$, where R is a C1-C10 group. R includes a functional group selected from the group consisting of one or more of —I, —Br, —Cl, —$NH_2$, —COOH, —OH, —SH, —$N_3$, —S(═O)—, an alkene group, an alkyne group, an imine group, an ether group, an ester group, an aldehyde group, a ketone group, an amide group, a sulfone group, a carboxyl group, an acetic acid group, a cyanide group, an allene group, an alcohol group, an amine group, a phosphine group, a phosphite group, an aniline group, a pyridine group, and a pyrrole group.

In some embodiments, the small molecules include an electron, an anion, a cation, $H^+$, $O_2$, $H_2O$, $NH_3$, HF, HCl, ROH, or $RNH_2$, where R is a $C_1$-$C_{10}$ group. R includes a functional group selected from the group consisting of one or more of —I, —Br, —Cl, —F, —$NH_2$, —COOH, —OH, —SH, —$N_3$, —S(═O)—, an alkene group, an alkyne group, an imine group, an ether group, an ester group, an aldehyde group, a ketone group, an amide group, a sulfone group, a carboxyl group, an acetic acid group, a cyanide group, an allene group, an alcohol group, an amine group, a phosphine group, a phosphite group, an aniline group, a pyridine group, and a pyrrole group. In some embodiments, the chemical reporter molecule and the small molecules are different molecules.

Figure 8A:
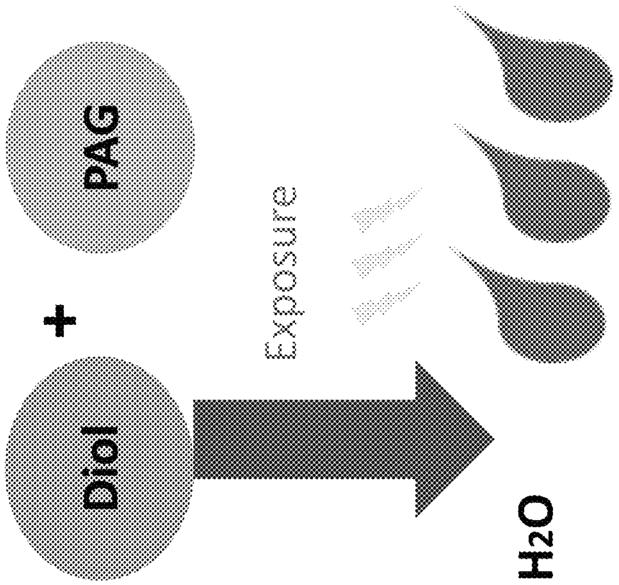
FIGS. 8A and 8B illustrate chemical reactions underlayer material undergo when irradiated with actinic radiation according to embodiments of the disclosure.

A first reaction mechanism is illustrated in FIG. 8A. In this embodiment, water is the small molecule, which is released from a target group having a diol group. The chemical reporter molecule is an $H^+$ cation released by the interaction of the actinic radiation and a photoacid generator (PAG). The PAG may be a photosensitive functional group on the pendant organic group or it may be a separate compound in the photoresist composition. Upon exposure to actinic radiation, the PAG releases $H^+$ and the $H^+$ transfers from the PAG to the diol group. The diol group releases the water molecule when it receives the $H^+$. The water molecule subsequently diffuses to the photoresist layer 15 during a post exposure baking and advances further chemical reactions such as hydrolysis, condensation, nucleophilic addition, or acid-base reactions. The action of the small molecule, such as water, in the photoresist layer allows a reduced exposure dose to be used during the selective exposure operation in some embodiments.

Figure 8B:
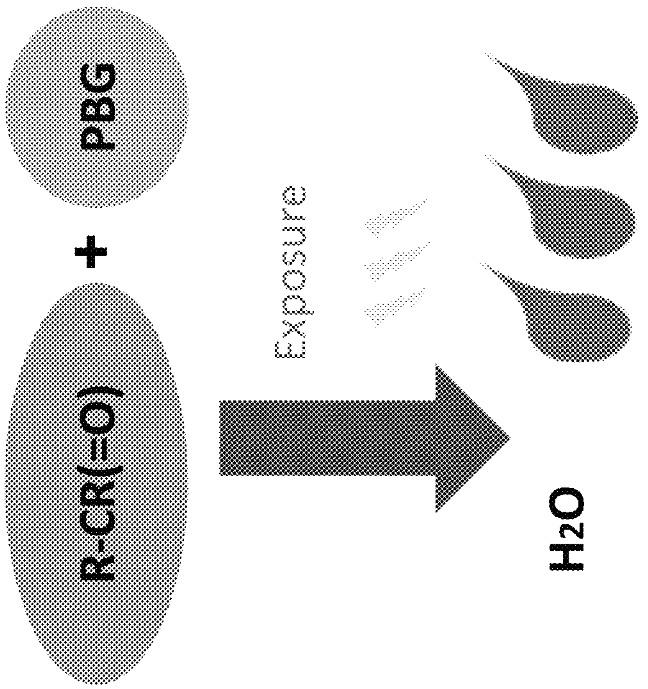

In a second reaction mechanism according to some embodiments, water is generated as the small molecule from a target group having a carbonyl group, such as an aldehyde or a ketone. The polymer composition includes a photobase generator (PBG). As shown in FIG. 8B, an interaction between the actinic radiation and the PBG generates an amine as a chemical reporter molecule. The amine subsequently reacts with the carbonyl group (R—CR(═O)) of target group on the polymer and generates a water molecule along a C═N double bond formation. The water molecule subsequently diffuses to the photoresist layer 15 during the post-exposure bake, and proceeds to advance chemical reactions such as hydrolysis, condensation, nucleophilic addition, and acid-base reactions in the photoresist layer. The action of the small molecule, such as water, in the photoresist layer allows a reduced exposure dose to be used during the selective exposure operation in some embodiments.

Figure 9:
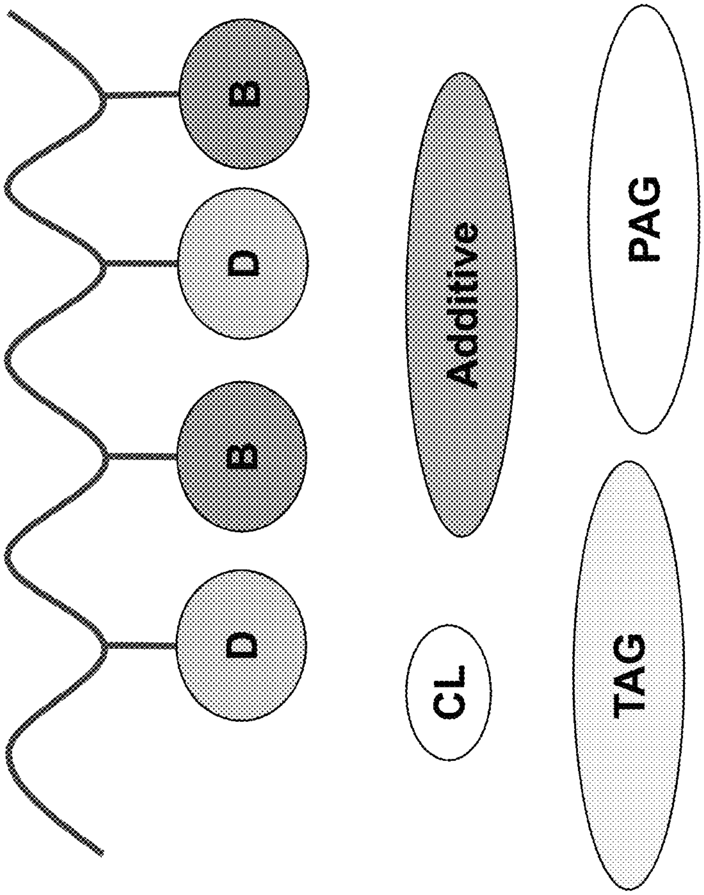
FIG. 9 illustrates an underlayer composition according to embodiments of the disclosure.

In some embodiments, the polymer composition of the resist underlayer 20 includes a polymer having one or more pendant diol target groups D and one or more pendant organic groups B, and the photoacid generator PAG is a separate compound in the polymer composition, as shown in FIG. 9. The PAG generates photoacids as a result of the actinic radiation exposure and then the photoacids trigger the diol groups D to release water molecules in the exposed areas during the post exposure bake. The water molecules subsequently diffuse into photoresist layer. In some embodiments, the photoresist is a metal-containing photoresist. The water advances crosslinking of the metal-containing photoresist or generates metal oxide in the exposed areas during the post exposure bake. Because of the water supplement from the resist underlayer, the metal-containing photoresist is strengthened and the exposure dose can be reduced. In some embodiments, the polymer composition optionally includes a thermal acid generator TAG, a crosslinker CL, and additives, such as a surfactant.

The diol D can be 1,n-diol, where n>0. The structure of the diol D can be non-cyclic or cyclic, and the cyclic structure can be an aromatic or a non-aromatic ring. In some embodiments, the diol D is a substituted or unsubstituted C2-C30 group. In some embodiments, the C2-C30 group is substituted with one or more of —I, —Br, —Cl, —F, —$NH_2$, —COOH, —OH, —SH, —$N_3$, —S(═O)—, an alkene group, an alkyne group, an imine group, an ether group, an ester group, an aldehyde group, a ketone group, an amide group, a sulfone group, an acetic acid group, a carboxylic acid group, a cyanide group, an allene group, an alcohol group, an amine group, a phosphine group, a phosphite group, an aniline group, a pyridine group, or a pyrrole group.

The organic group B can be a non-cyclic structure or a cyclic structure, and the cyclic structure can be an aromatic or a non-aromatic ring. In some embodiments, the organic group B is a substituted or unsubstituted C1-C30 group. In some embodiments, the C1-C30 group is substituted with one or more of —I, —Br, —Cl, —F, —$NH_2$, —COOH, —OH, —SH, —$N_3$, —S(═O)—, an alkene group, an alkyne group, an imine group, an ether group, an ester group, an aldehyde group, a ketone group, an amide group, a sulfone group, an acetic acid group, a carboxylic acid group, or a cyanide group.

The crosslinker CL of the resist underlayer 20 may be any suitable crosslinker. The cross linker CL reacts with a functional group on one polymer and a functional group on another polymer to crosslink and bond the two polymer chains together. This bonding and crosslinking increases the molecular weight of the polymer products of the crosslinking reaction and increases the overall density of the underlayer. In some embodiments, the crosslinker is a separate component of the resist underlayer polymer composition. In other embodiments, the crosslinker is attached to the polymer in the resist underlayer polymer composition.

In some embodiments the crosslinker has the following structure:

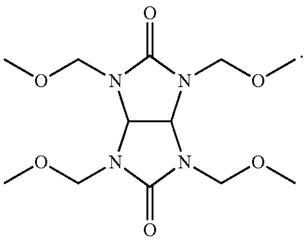

In other embodiments, the crosslinker has the following structure:

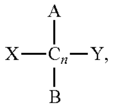

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the crosslinker include the following:

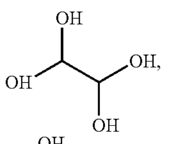 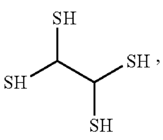 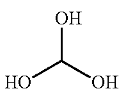 ,

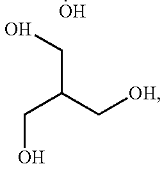 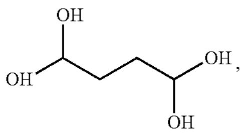

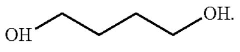

Alternatively, instead of or in addition to the crosslinker being added to the resist underlayer composition, a coupling reagent is added in some embodiments, in which the coupling reagent is added in addition to the cross linker agent. The coupling reagent assists the crosslinking reaction by reacting with the functional groups on the polymer before the crosslinker, allowing for a reduction in the reaction energy of the crosslinking reaction and an increase in the rate of reaction. The bonded coupling reagent then reacts with the crosslinker agent, thereby coupling the crosslinker to the polymers.

In some embodiments, the coupling reagent has the following structure:

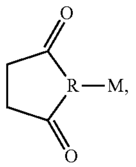

where R is a carbon atom, a nitrogen atom, a sulfur atom, or an oxygen atom; M includes a chlorine atom, a bromine atom, an iodine atom, —$NO_2$; —$SO_3$—; —H—; —CN; —NCO, —OCN; —$CO_2$—; —OH; —OR*, —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

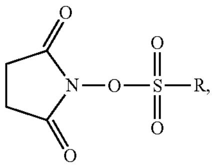

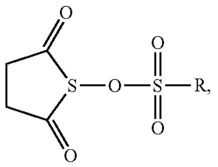

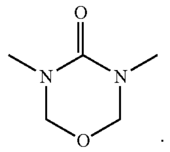

In some embodiments, the thermal acid generator (TAG) is one or more selected from the group consisting of

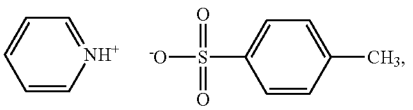

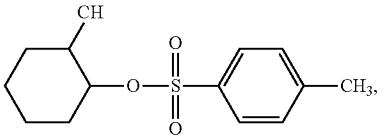

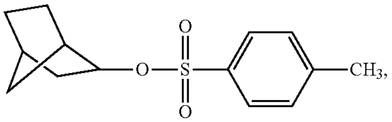

-continued

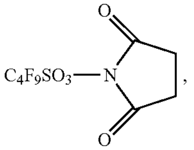

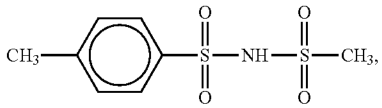

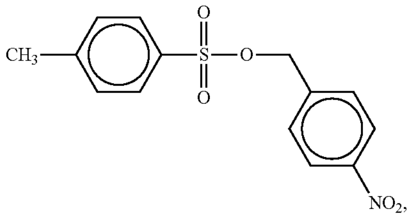

and

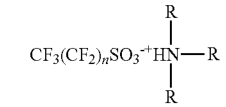

where 0≤n≤10, and R is hydrogen or a substituted or unsubstituted C1-C10 alkyl group. In some embodiments, the thermal acid generator is selected from $NH_4^+C_4F_9SO_3^-$ and $NH_4^+CF_3SO_3$.

In some embodiments, the first baking operation S120 activates the TAG and generates an acid. Some of the acid generated by the TAG may diffuse from the underlayer 20 into the photoresist layer 15, and small molecules may be generated as a result of the acid generation by the TAG. However, the effect on the photoresist layer 15 of the TAG is limited, as most of the acid generated by the TAG is used for crosslinking the underlayer polymer. Furthermore, TAG remaining after the crosslinking of the underlayer polymer evaporates during the first baking operation in some embodiments. Small molecule generation by the TAG is insignificant compared to small molecule generation caused by photoacid generator (PAG). Any acid generated by TAG remaining by the time of post-exposure baking operation S160 is negligible compared to the amount of acid generated by the photoacid generator (PAG). Thus, the effect of the TAG on the photoresist baking S140, radiation exposure S150, post exposure baking S160, and development operations S170 is negligible compared to the effect of the PAG in some embodiments.

The PAG or a combination of the PAG and TAG are included in the underlayer at a concentration ranging from about 0.1 wt. % to about 20 wt. % relative to the total weight of the polymer composition. At concentrations below about 0.1 wt. % there may not be a sufficient amount of the PAG or TAG to provide the desired effect. At concentrations of the PAG or TAG greater than about 20 wt. % substantial improvement in the photoresist pattern profile may not be obtained.

In some embodiments, an additive, such as a surfactant, is added to the resist underlayer polymer composition. In some embodiments, the surfactants include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, and polyoxyethylene sorbitan fatty acid esters.

Specific examples of materials used as surfactants in some embodiments include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether, polyoxyethylene cetyl ether, fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations thereof, or the like.

In some embodiments, a main chain of the polymer is selected from the group consisting of a polystyrene, a polyhydroxystyrene, a polyacrylate, a polymethylacrylate, a polymethylmethacrylate, a polyacrylic acid, a polyvinyl ester, a polymaleic ester, a poly(methacrylonitrile), and poly(methacrylamide). In some embodiments, the pendant organic groups are photosensitive functional groups that release a chemical reporter molecule in the portions of the resist underlayer exposed to actinic radiation. In some embodiments, the organic group is a substituted or unsubstituted C3-C30 aliphatic or aromatic group having at least one photosensitive functional group. In some embodiments, the photosensitive functional group is one or more of an epoxy group, an azo group, an alkyl halide group, an imine group, an alkene group, an alkyne group, a peroxide group, a ketone group, an aldehyde group, an allene group, an aromatic group or a heterocyclic group. The aromatic groups can be phenyl, napthalenyl, phenanthrenyl, anthracenyl, phenalenyl, and other aromatic groups containing three to ten-membered rings. In some embodiments, the pendant target groups include a substituted, non-cyclic or cyclic structure. The cyclic structure can be an aromatic or a non-aromatic ring. In some embodiments, the target group is a C1-C30 group including a functional group selected from one or more of the group consisting of —I, —Br, —Cl, $—NH_2$, —COOH, —OH, —SH, $—N_3$, —S(═O)—, an alkene group, an alkyne group, an imine group, an ether group, an ester group, an aldehyde group, a ketone group, an amide group, a sulfone group, a carboxyl group, a cyanide group, an allene group, an alcohol group, a diol group, a triol group, an amine group, a phosphine group, a phosphite group, an aniline group, a pyridine group, and a pyrrole group.

In some embodiments, the various components of the resist underlayer polymer composition are mixed in a solvent to facilitate application of the polymer composition to the substrate. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

Figure 10:
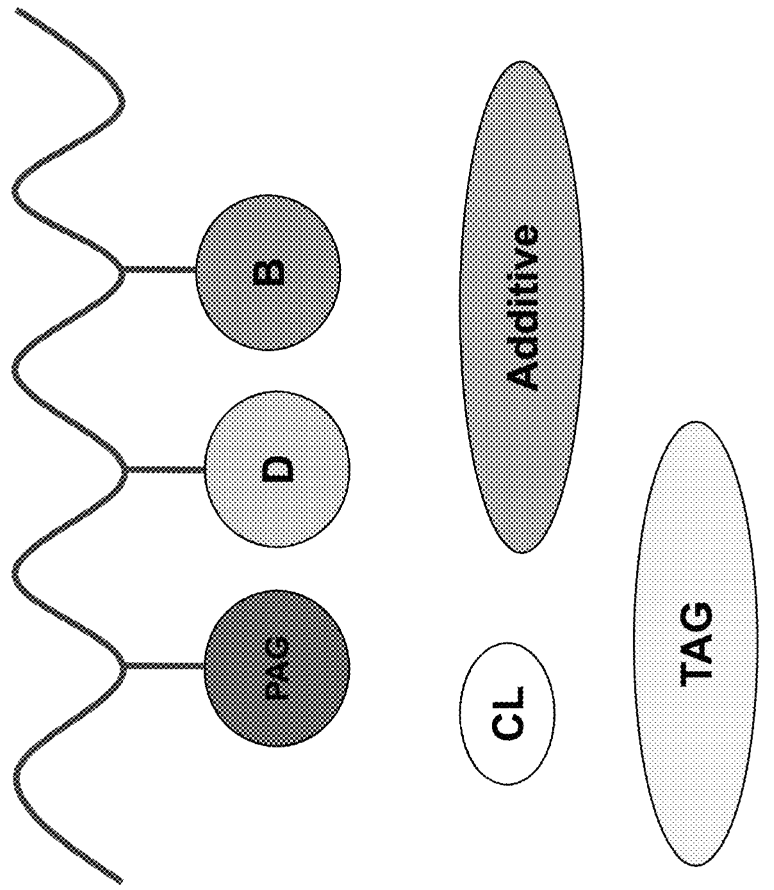
FIG. 10 illustrates an underlayer composition according to embodiments of the disclosure.

In some embodiments, the PAG is bound to the polymer in the resist underlayer polymer composition, as shown in FIG. 10. The polymer includes diol groups D and organic groups B. The bound PAG generates photoacid chemical reporter molecules after exposure and then the photoacids trigger the diol groups to release a small molecule, such as water, in the exposed areas during the post exposure baking operation. The water molecules subsequently diffuse into photoresist layer. In some embodiments, the photoresist is a metal-containing photoresist. The water advances crosslinking of the metal-containing photoresist or generates metal oxide in the exposed areas during the post exposure bake. Because of the water supplement from the resist underlayer, the metal-containing photoresist is strengthened and the exposure dose can be reduced. In some embodiments, the polymer composition optionally includes a thermal acid generator TAG, a crosslinker CL, and additives, such as a surfactant.

Figure 11:
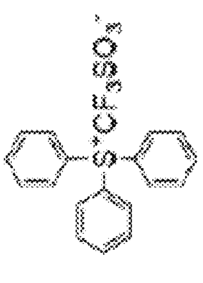
FIG. 11 illustrates photoacid generators according to embodiments of the disclosure.
Figure 11:
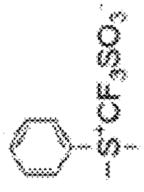
Figure 11:
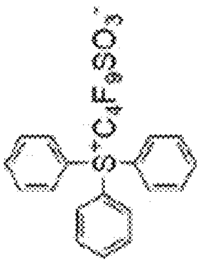
Figure 11:
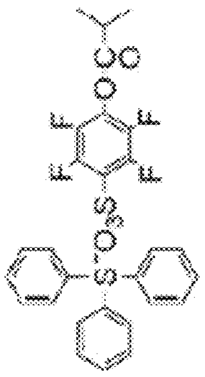
Figure 11:
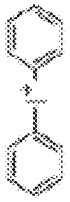
Figure 11:
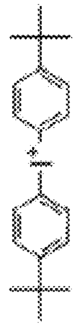
Figure 11:
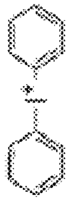
Figure 11:
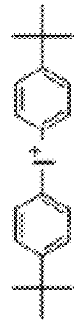
Figure 11:
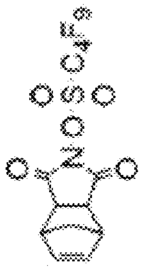

In some embodiments, the free PAG compounds in the composition illustrated in FIG. 9 and the bound PAG groups illustrated in FIG. 10 are one or more compounds or groups selected from the group consisting of a C3-C50 alkyl group containing fluorine atoms with at least one light-sensitive functional group. The light-sensitive functional groups include sulfonium salts, triphenylsulfonium triflate, triphenylsulfonium nonaflate, dimethylsulfonium triflate, iodonium salts, diphenyliodonium nonaflate, norbornene dicarboximidyl nonaflate, epoxy groups, azo groups, alkyl halide groups, imine groups, alkene groups, alkyne groups, peroxide groups, ketone groups, aldehyde groups, allene groups, aromatic groups, or heterocyclic groups. In some embodiments, the aromatic groups are phenyl groups, napthalenyl groups, phenanthrenyl groups, anthracenyl groups, phenalenyl groups, or other aromatic groups containing one or more three to ten-membered rings. Some examples of photoacid generators (PAGs) according to embodiments of the disclosure are illustrated in FIG. 11.

The diol group D, organic group B, crosslinker CL, TAG, and additive can be any of the diol groups, organic groups, crosslinkers, TAGs, and additives disclosed herein in reference to the composition illustrated in FIG. 9.

Figure 12A:
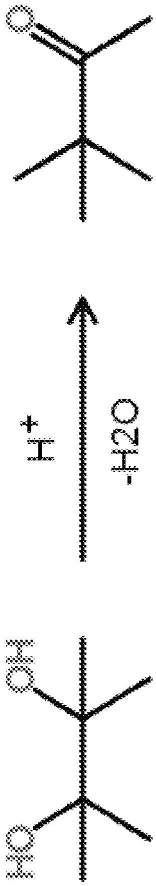
FIGS. 12A, 12B, 12C, 12D, 12E, and 12F illustrates small molecule generation reactions according to embodiments of the disclosure.
Figure 12B:
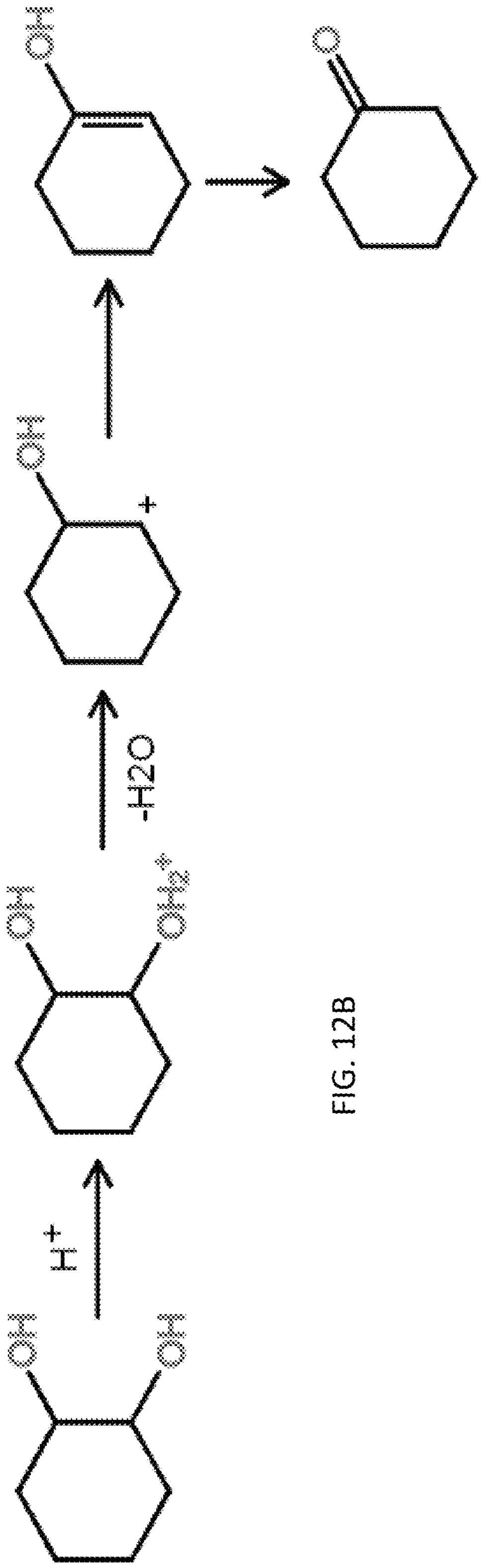
Figure 12C:
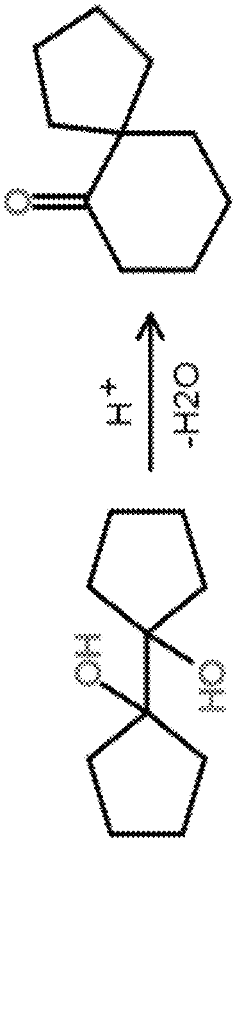
Figure 12D:
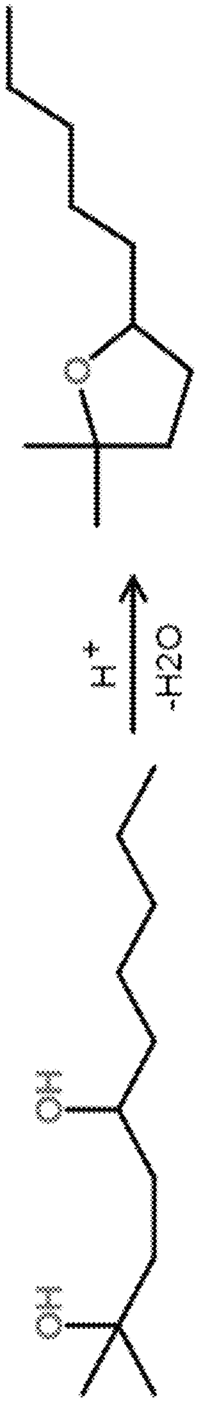
Figure 12E:
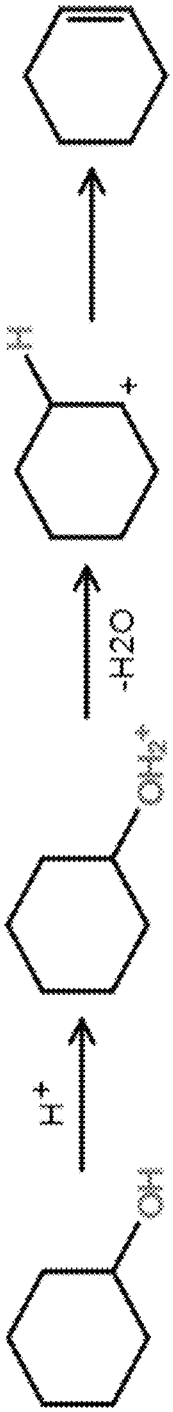
Figure 12F:
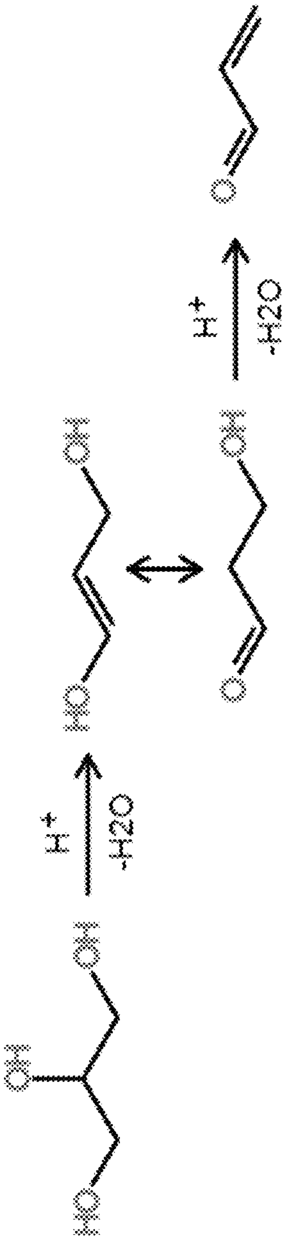

FIGS. 12A-12F illustrate various reaction mechanisms of pendant target groups on the resist underlayer polymer to produce water according to embodiments of the disclosure. Water elimination by pinacol rearrangement is illustrated in FIG. 12A. An acid ($H^+$) chemical reporter molecule reacts with a diol group to release water. In FIG. 12B, the hydroxyl groups of the diol functional group are substituents on a cyclic alkyl structure. The 1,2 diol structure releases water upon reacting with an acid. FIG. 12C illustrates the release of water by 1,2 diols coupled with ring expansion. The five membered alkyl ring expands to six-member ring upon the release of a water molecule after reacting with an acid. FIG. 12D illustrates water release by the target group by a 1,n-diol (where n=4) with ring formation. The reaction of target group with the acid releases water and forms a five-member heterocyclic ring. FIG. 12E illustrates water release by a cyclic alcohol target group and subsequent carbon-carbon double bond formation upon reaction with an acid. FIG. 12F illustrates the release of two water molecules by a triol target group by a two-step reaction of the target group and acid molecules.

In some embodiments, a second mechanism is employed to generate the small molecules. In the second mechanism, a photobase generator (PBG) is used to generate the chemical reporter molecule, and the target group is a carbonyl group, such as an aldehyde group or a ketone group.

Figure 13:
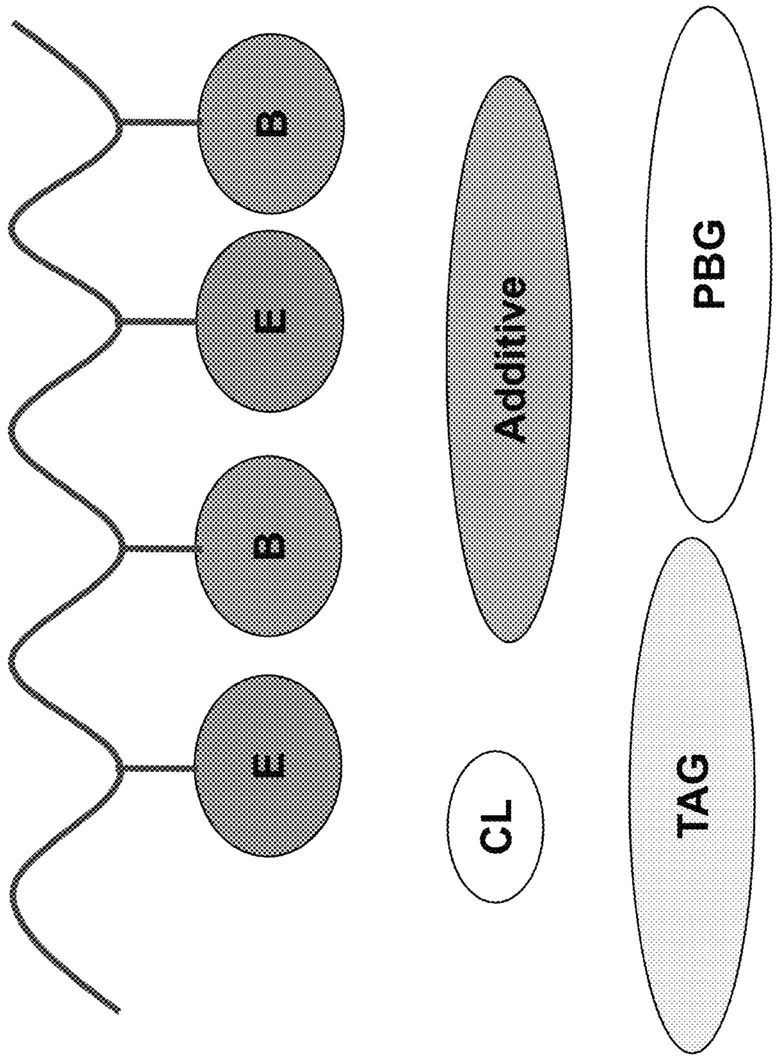
FIG. 13 illustrates an underlayer composition according to embodiments of the disclosure.

In some embodiments, the polymer composition includes a polymer having one or more pendant carbonyl target groups E and one of more pendant organic groups B. The PBG is a separate compound in the polymer composition, as shown in FIG. 13. The PBG generates a photobase, such as an amine, as a result of the actinic radiation exposure and then the photobase triggers the carbonyl group E to release water molecules in the exposed areas during the post exposure bake. The water molecules subsequently diffuse into photoresist layer. In some embodiments, the photoresist is a metal-containing photoresist. The water advances crosslinking of the metal-containing photoresist or generates metal oxide in the exposed areas during the post exposure bake. Because of the water supplement from the resist underlayer, the metal-containing photoresist is strengthened and the exposure dose can be reduced. In some embodiments, the polymer composition optionally includes a thermal acid generator TAG, a crosslinker CL, and additives, such as a surfactant.

In some embodiments, the target group E has a carbonyl group. In some embodiments, the target group can be an aldehyde group, a ketone group, an ester group, an amide group, or any other suitable group including a carbonyl group. In some embodiments, the pendant target groups include a substituted, non-cyclic or cyclic structure. The cyclic structure can be an aromatic or a non-aromatic ring. In some embodiments, the target group is a C1-C30 group including a functional group selected from one or more of the group consisting of —I, —Br, —Cl, $—NH_2$, —COOH, —OH, —SH, $—N_3$, —S(═O)—, an alkene group, an alkyne group, an imine group, an ether group, an ester group, an aldehyde group, a ketone group, an amide group, a sulfone group, a carboxyl group, a cyanide group, an allene group, an alcohol group, an amine group, a phosphine group, a phosphite group, an aniline group, a pyridine group, and a pyrrole group.

The organic group B, crosslinker CL, TAG, and additive can be any of the diol groups, organic groups, crosslinkers, TAGs, and additives disclosed herein in reference to the composition illustrated in FIG. 9.

Figure 14B:
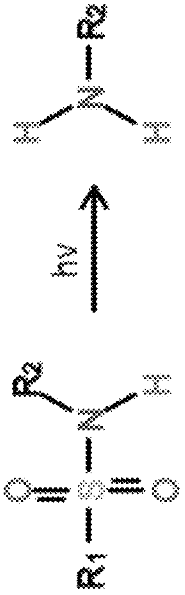
FIGS. 14A and 14B illustrate base generation by photobase generators according to embodiments of the disclosure.
Figure 14A:
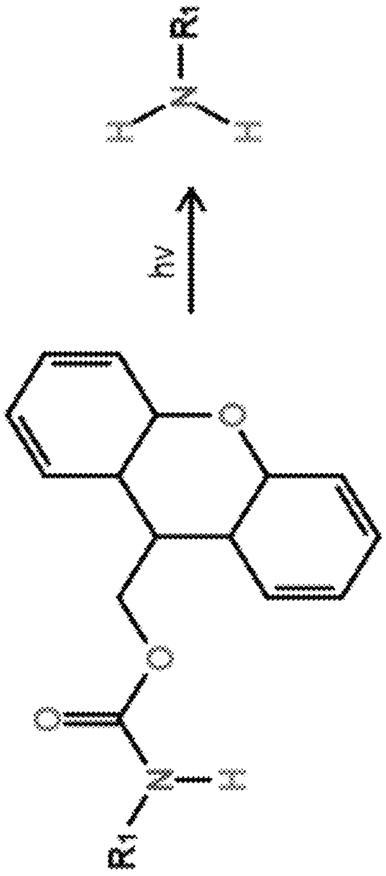
Figure 14C:
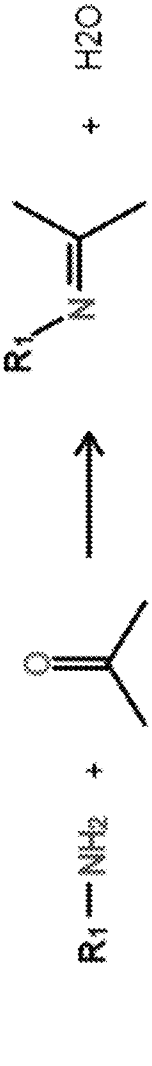
FIG. 14C illustrates a small molecule generation reaction according to an embodiment of the disclosure.

Examples of photobase generators and reactions showing the generation of amine chemical reporter molecules upon the exposure of the PBG to actinic radiation are shown in FIGS. 14A and 14B. R1 and R2 are substituted or unsubstituted C1-C15 alkyl groups in some embodiments. FIG. 14C illustrates the reaction of the amine chemical reporter with the carbonyl group on the target group to form water, as a small molecule. In this reaction, the amine reacts with the carbonyl group to form a C═N double bond on the target group, while releasing a water molecule.

In some embodiments, the photobase generator is one or more selected from the group consisting of quaternary ammonium dithiocarbamates, a aminoketones, oxime-urethane containing molecules, dibenzophenoneoxime hexamethylene diurethan, ammonium tetraorganylborate salts, and N-(2-nitrobenzyloxycarbonyl) cyclic amines, and combinations thereof. In some embodiments, the thermal base generator is one or more selected from the group consisting of:

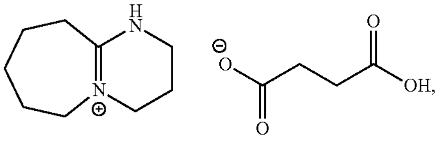

-continued

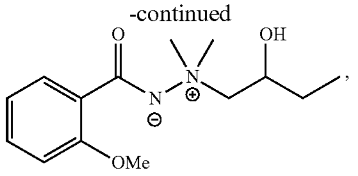

Me: methyl

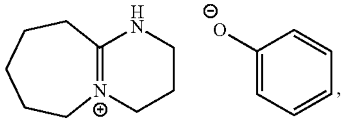

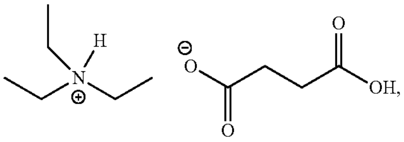

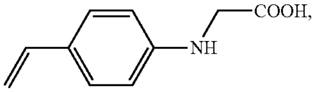

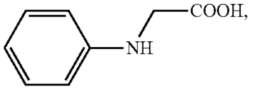

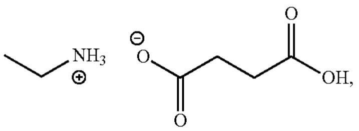

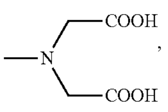

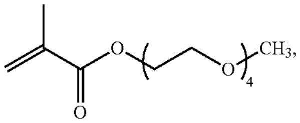

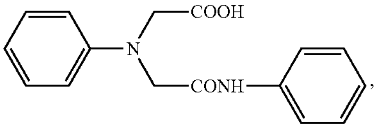

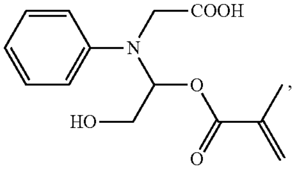

and

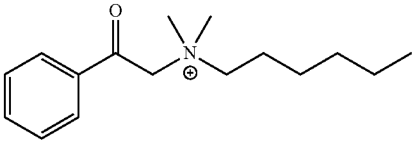

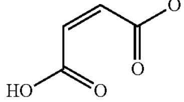

In some embodiments, the resist underlayer 20 is formed by preparing an underlayer coating composition of any of the polymer composition components disclosed herein in a solvent. The solvent can be any suitable solvent for dissolving the polymer and the selected components of the compositions. The underlayer coating composition is applied over a substrate 10 or target layer, such as by spin coating. Then the underlayer composition is baked to dry the underlayer, as explained herein in reference to FIG. 1.

In some embodiments, the thickness of the resist underlayer 20 ranges from about 2 nm to about 300 nm, and in other embodiments, the resist underlayer thickness ranges from about 20 nm to about 100 nm. In some embodiments, the thickness of the resist underlayer 20 ranges from about 40 nm to about 80 nm. Resist underlayer thicknesses less than the disclosed ranges may be insufficient to provide adequate photoresist adhesion, LWR improvement, and anti-reflective properties. Resist underlayer thicknesses greater than the disclosed ranges may be unnecessarily thick and may not provide further improvement in resist layer adhesion, LWR improvement, and scum reduction.

In some embodiments, the photoresist layer 15 is a photosensitive layer that is patterned by exposure to actinic radiation. Typically, the chemical properties of the photoresist regions struck by incident radiation change in a manner that depends on the type of photoresist used. Photoresist layers 15 are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Whether a resist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

Figure 15A:
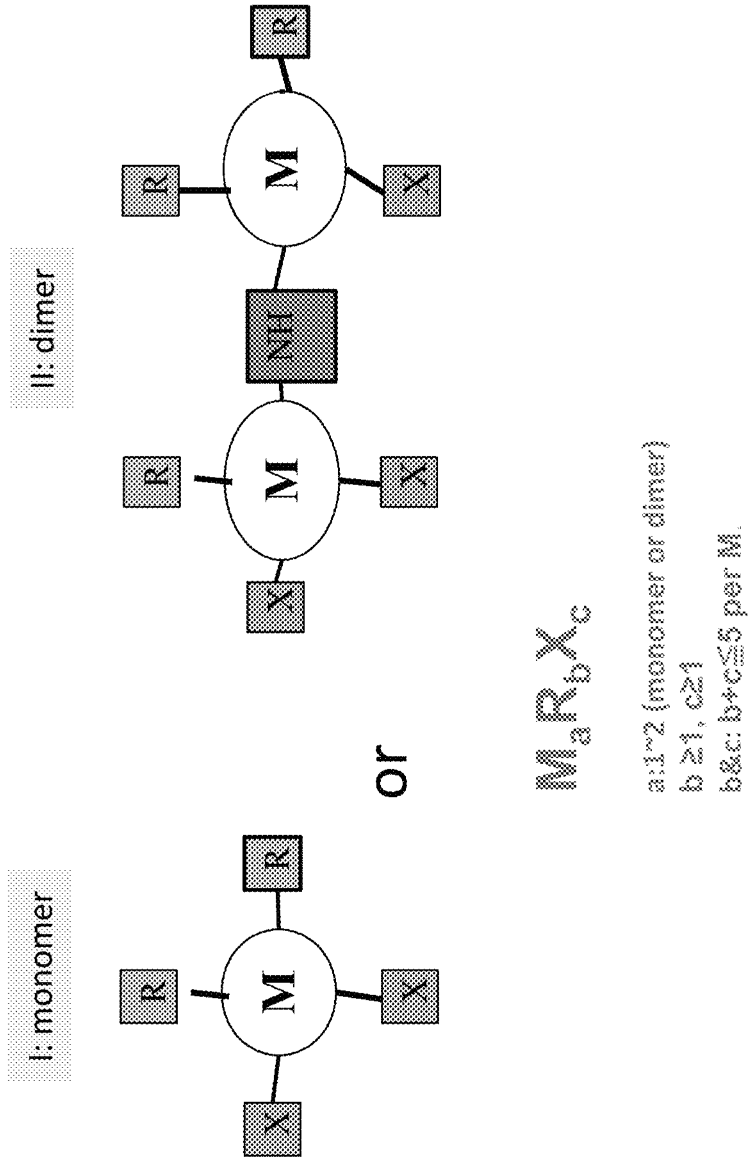
FIG. 15A shows organometallic precursors according to embodiments of the disclosure.

In some embodiments, the photoresist layer 15 is made of a photoresist composition, including a first compound or a first precursor and a second compound or a second precursor combined in a vapor state. The first precursor or first compound is an organometallic having a formula: $M_aR_bX_c$, as shown in FIG. 15A, where M is at least one of Sn, Bi, Sb, In, Te, Ti, Zr, Hf, V, Co, Mo, W, Al, Ga, Si, Ge, P, As, Y, La, Ce, or Lu; and R is a substituted or unsubstituted alkyl, alkenyl, or carboxylate group. In some embodiments, M is selected from the group consisting of Sn, Bi, Sb, In, Te, and combinations thereof. In some embodiments, R is a C3-C6 alkyl, alkenyl, or carboxylate. In some embodiments, R is selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, tert-hexyl, and combinations thereof. X is a ligand, ion, or other moiety, which is reactive with the second compound or second precursor; and $1\leq a\leq 2$, $b\geq 1$, $c\geq 1$, and $b+c\leq 5$ in some embodiments. In some embodiments, the alkyl, alkenyl, or carboxylate group is substituted with one or more fluoro groups. In some embodiments, the organometallic precursor is a dimer, as shown in FIG. 15A, where each monomer unit is linked by an amine group. Each monomer has a formula: $M_aR_bX_c$, as defined above.

In some embodiments, R is alkyl, such as $C_nH_{2n+1}$ where $n\geq 3$. In some embodiments, R is fluorinated, e.g., having the formula $C_nF_xH_{((2n+1)-x)}$. In some embodiments, R has at least one beta-hydrogen or beta-fluorine. In some embodiments, R is selected from the group consisting of i-propyl, n-propyl, t-butyl, i-butyl, n-butyl, sec-butyl, n-pentyl, i-pentyl, t-pentyl, and sec-pentyl, and combinations thereof.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

Figure 15B:
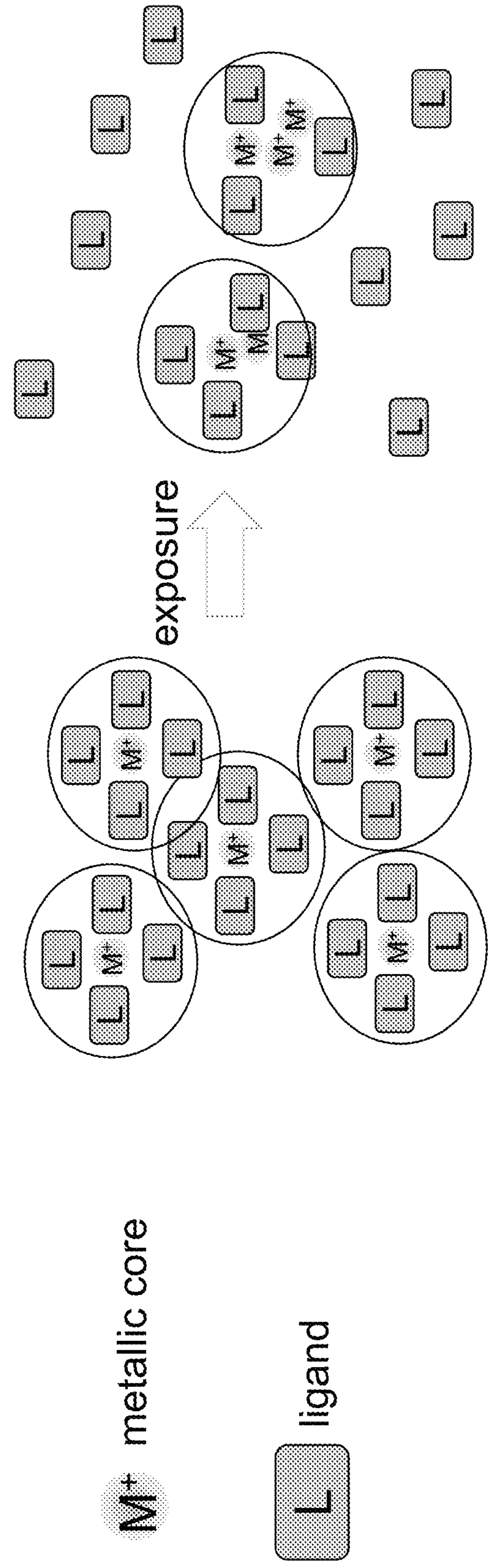
FIG. 15B shows a reaction the organometallic precursors undergo when exposed to actinic radiation.

In some embodiments, the first organometallic compound or first organometallic precursor includes a metallic core $M^+$ with ligands L attached to the metallic core $M^+$, as shown in FIG. 15B. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

In some embodiments, the organometallic precursor or organometallic compound include a sec-hexyl tris(dimethylamino)tin, t-hexyl tris(dimethylamino)tin, i-hexyl tris(dimethylamino) tin, n-hexyl tris(dimethylamino)tin, sec-pentyl tris(dimethylamino)tin, t-pentyl tris(dimethylamino)tin, i-pentyl tris(dimethylamino)tin, n-pentyl tris(dimethylamino)tin, sec-butyl tris(dimethylamino)tin, t-butyl tris(dimethylamino)tin, i-butyl tris(dimethylamino)tin, n-butyl tris(dimethylamino)tin, sec-butyl tris(dimethylamino)tin, i-propyltris(dimethylamino)tin, n-propyl tris(diethylamino) tin, and analogous alkyl(tris) (t-butoxy)tin compounds, including sec-hexyl tris(t-butoxy)tin, t-hexyl tris(t-butoxy) tin, i-hexyl tris(t-butoxy)tin, n-hexyl tris(t-butoxy)tin, sec-pentyl tris(t-butoxy)tin, t-pentyl tris(t-butoxy)tin, i-pentyl tris(t-butoxy)tin, n-pentyl tris(t-butoxy)tin, t-butyl tris(t-butoxy)tin, i-butyl tris(butoxy)tin, n-butyl tris(butoxy)tin, sec-butyl tris(butoxy)tin, i-propyl(tris)dimethylamino tin, or n-propyl tris(butoxy)tin. In some embodiments, the organometallic precursors or organometallic compounds are fluorinated. In some embodiments, the organometallic precursors or compounds have a boiling point less than about 200° C.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is at least one of an amine, a borane, a phosphine, or water. In some embodiments, the amine has a formula $N_pH_nX_m$, where $0\leq n\leq 3$, $0\leq m\leq 3$, $n+m=3$ when p is 1, and $n+m=4$ when p is 2, and each X is independently a halogen selected from the group consisting of F, Cl, Br, and I. In some embodiments, the borane has a formula $B_pH_nX_m$, where 0≤n≤3, 0≤m≤3, n+m=3 when p is 1, and n+m=4 when p is 2, and each X is independently a halogen selected from the group consisting of F, Cl, Br, and I. In some embodiments, the phosphine has a formula $P_pH_nX_m$, where 0≤n≤3, 0≤m≤3, n+m=3, when p is 1, or n+m=4 when p is 2, and each X is independently a halogen selected from the group consisting of F, Cl, Br, and I.

FIG. 15B shows a reaction metallic precursors undergo as a result of exposure to actinic radiation in some embodiments. As a result of exposure to the actinic radiation, ligand groups L are split off from the metallic core $M^+$ of the metallic precursors, and two or more metallic precursor cores bond with each other.

Figure 15C:
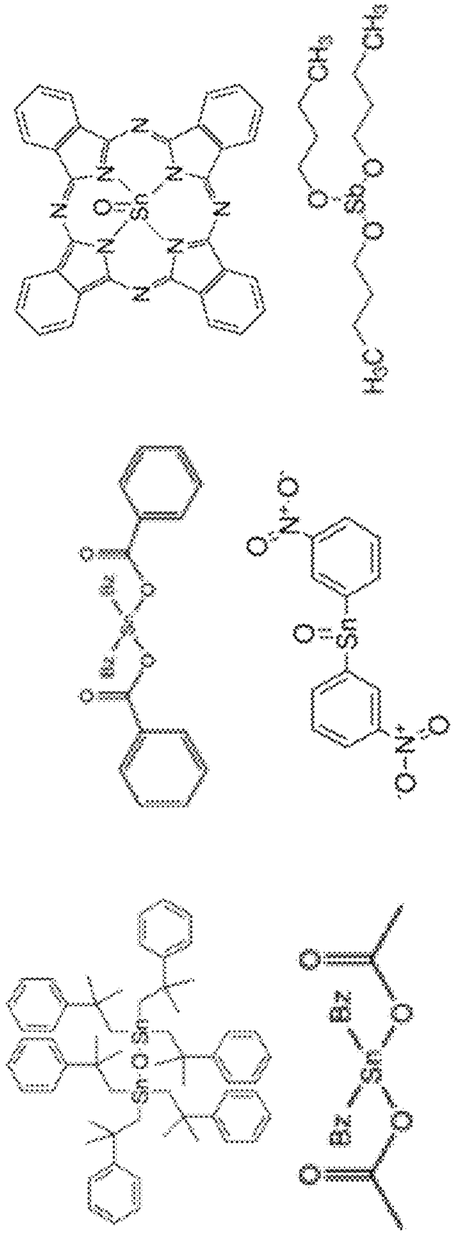
FIG. 15C shows examples of organometallic precursors according to embodiments of the disclosure.
Figure 15D:
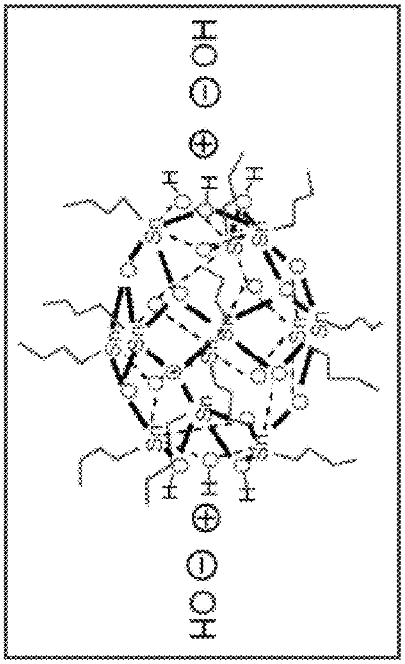
FIG. 15D illustrates an organometallic resist material according to embodiments of the disclosure.
Figure 15E:
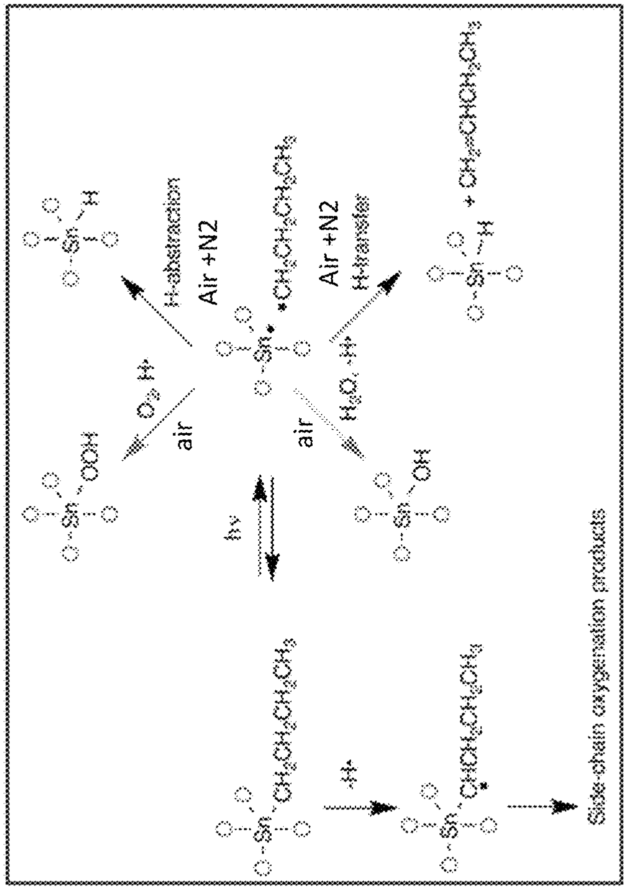
FIG. 15E illustrates reactions an organometallic resist material undergoes according to embodiments of the disclosure.

FIG. 15C show examples of organometallic precursors according to embodiments of the disclosure. In FIG. 15C Bz is a benzene group. FIG. 15D illustrates a tin oxide organometallic resist material according to embodiments of the disclosure. FIG. 15E illustrates reactions a tin oxide organometallic resist material may undergo when exposed to actinic radiation hν. Different end products are obtained depending on whether the exposure organometallic resist material is exposed to air, nitrogen, water, or combinations thereof.

In some embodiments, the operation S130 of depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD). In other embodiments, the organometallic resist is applied to the substrate 10 or a target layer by a spin coating operation.

In some embodiments, the photoresist layer 15 is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the layer uniformity is not evaluated for portions of the coating within 1 centimeter of the edge. A person of ordinary skill in the art will recognize that additional ranges within the explicit ranges above are contemplated and are within the present disclosure.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

Figure 16:
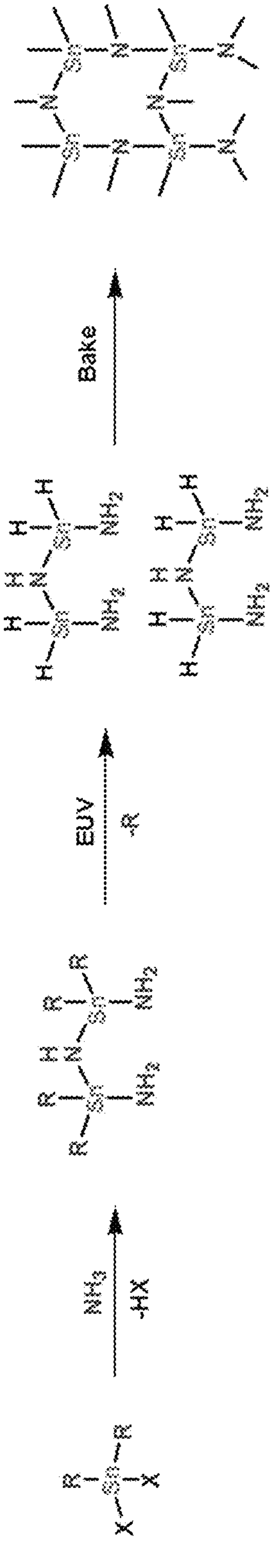
FIG. 16 shows a reaction the photoresist composition components undergo as a result of exposure to actinic radiation and heating according to an embodiment of the disclosure.

FIG. 16 shows a reaction the photoresist composition components undergo as a result of exposure to actinic radiation and heating according to an embodiment of the disclosure. FIG. 16 shows an exemplary chemical structure of the photoresist layer at various stages of the photoresist patterning method according to embodiments of the disclosure. As shown in FIG. 16, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and help prevent the outgassing of metal-containing photoresist material. Moreover, the hydrogen bonds of the amine groups can help control the effect moisture has on photoresist layer quality.

When subsequently exposed to extreme ultraviolet radiation, the organometallic compound absorbs the extreme ultraviolet radiation and one or more organic R groups are cleaved from the organometallic compound to form an amino metallic compound in the radiation exposed areas. Then, when the post-exposure bake (PEB) performed, the amino metallic compounds crosslink through the amine groups in some embodiments, as shown in FIG. 16. In some embodiments, partial crosslinking of the amino metallic compounds occurs as a result of the exposure to extreme ultraviolet radiation.

After PEB, the latent pattern in the photoresist layer is developed to form a patterned photoresist layer. In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-unexposed regions 52 of the cross-linked negative resist, exposing the surface of the underlayer 20, as shown in FIG. 5, and leaving behind well-defined exposed photoresist regions 50, having improved definition than provided by conventional negative photoresist photolithography.

After the developing operation S170, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 50 is in place. For example, an etching operation, using dry or wet etching, is performed in some embodiments, to transfer the pattern of the photoresist layer 50 through the underlayer 20 to the underlying substrate 10, forming openings 55' as shown in FIG. 6. The underlayer 20 and the substrate 10 have a different etch resistance than the photoresist layer 15. In some embodiments, the etchant is more selective to the underlayer 20 and substrate 10 than the photoresist layer 15. In some embodiments, a different etchant or etching parameters is used to etch the non-photocleaved portions of the underlayer 20*a* than to etch the substrate 10.

Figure 17:
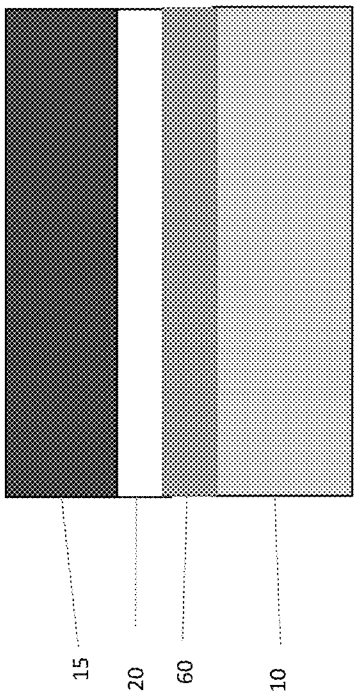
FIG. 17 shows a process stage of a sequential operation according to an embodiment of the disclosure.

In some embodiments, a target layer 60 to be patterned is disposed over the substrate prior to forming the underlayer 20, as shown in FIG. 17. In some embodiments, the target layer 60 is a metallization layer or a dielectric layer, such as a passivation layer, disposed over a metallization layer. In embodiments where the target layer 60 is a metallization layer, the target layer 60 is formed of a conductive material using metallization processes, and metal deposition techniques, including chemical vapor deposition, atomic layer deposition, and physical vapor deposition (sputtering). Likewise, if the target layer 60 is a dielectric layer, the target layer 60 is formed by dielectric layer formation techniques, including thermal oxidation, chemical vapor deposition, atomic layer deposition, and physical vapor deposition.

Figure 18A:
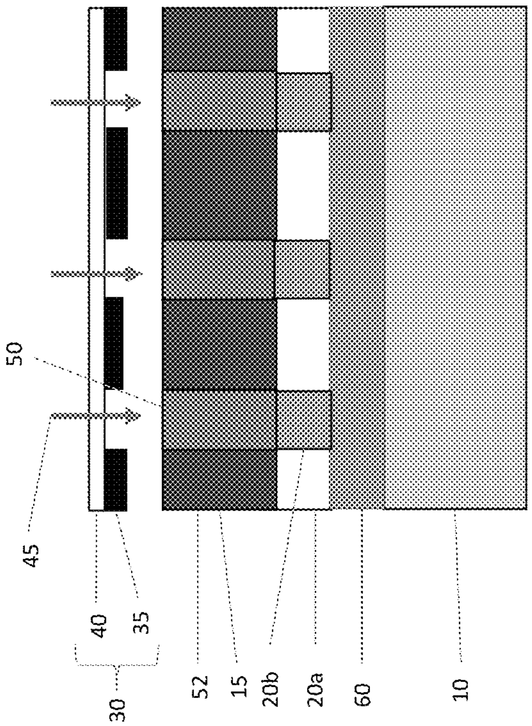
FIGS. 18A and 18B show a process stage of a sequential operation according to embodiments of the disclosure.
Figure 18B:
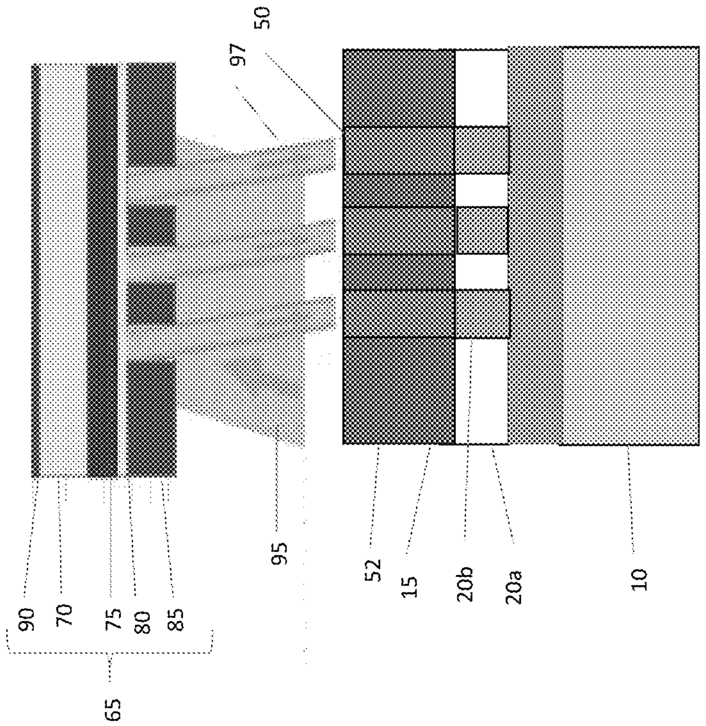

The photoresist layer 15 and resist underlayer 20 are subsequently selectively exposed to actinic radiation 45/97 to form exposed regions 50 and 20*b* and unexposed regions 52 and 20*a*, in the photoresist layer and underlayer, respectively, as shown in FIGS. 18A and 18B, and described herein in relation to FIGS. 3A and 3B. As explained herein the photoresist is a negative photoresist, wherein polymer cross-linking occurs in the exposed regions 50 in some embodiments.

Figure 19:
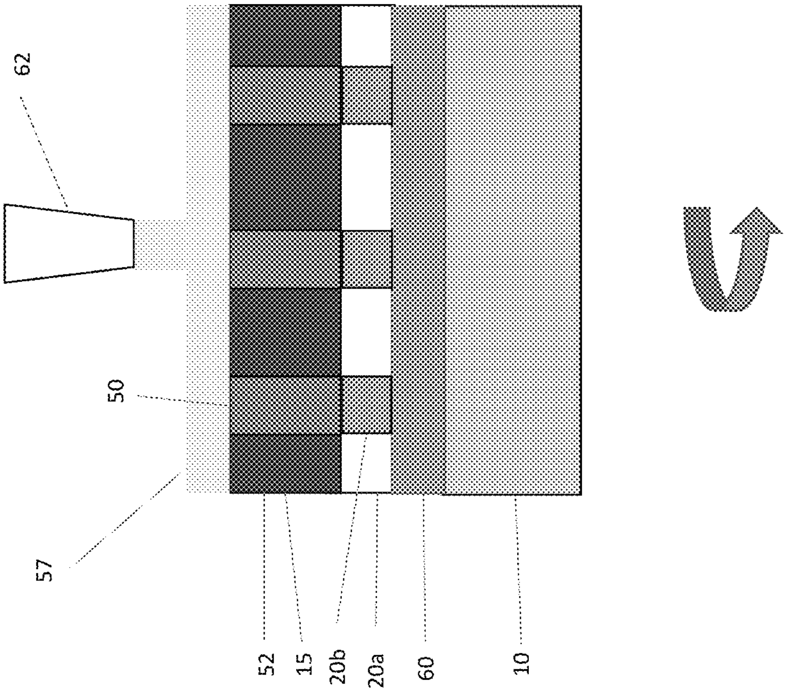
FIG. 19 shows a process stage of a sequential operation according to an embodiment of the disclosure.
Figure 20:
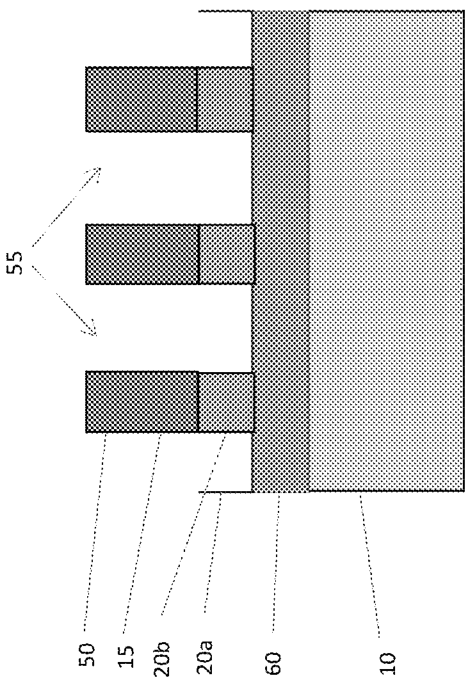
FIG. 20 shows a process stage of a sequential operation according to an embodiment of the disclosure.

As shown in FIG. 19, the unexposed photoresist regions 52 are developed by dispensing developer 57 from a dispenser 62 to form a pattern of photoresist openings 55, as shown in FIG. 20. The development operation is similar to that explained with reference to FIGS. 4 and 5, herein.

Figure 21:
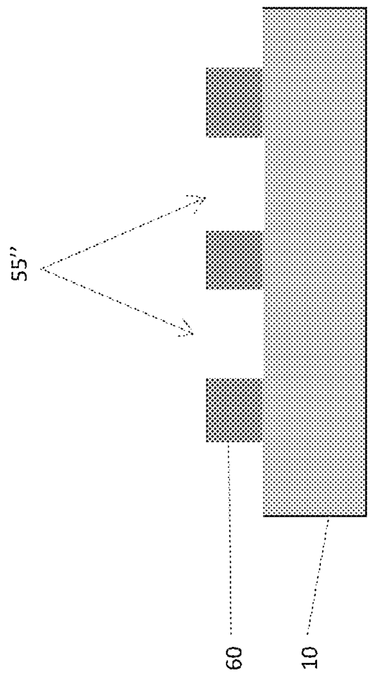
FIG. 21 shows a process stage of a sequential operation according to an embodiment of the disclosure.

Then as shown in FIG. 21, the pattern 55 in the photoresist layer 15 is transferred through the unexposed portion of the resist underlayer 20*a* to the layer to be patterned 60 using an etching operation and the photoresist layer 15 and exposed portion of the resist underlayer 20*b* are removed, as explained with reference to FIG. 6 to form pattern 55" in the layer to be patterned 60.

In some embodiments, an intermediate layer is provided between the substrate 10 or target layer 60 and the resist underlayer 20 (or BARC layer). The intermediate layer may have a composition that provides anti-reflective properties for the photolithography operation and/or hard mask properties. In some embodiments, the intermediate layer includes a silicon-containing layer (e.g., a silicon hard mask material). The intermediate layer may include a silicon-containing inorganic polymer. In other embodiments, the intermediate layer includes a siloxane polymer. In other embodiments, the intermediate layer includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The intermediate layer may be bonded to adjacent layers, such as by covalent bonding, hydrogen bonding, or hydrophilic-to-hydrophilic forces.

In some embodiments, the photoresist layer 15 includes a chromophore, counter ions, and a quencher.

In some embodiments, the photoresist patterning operation includes a second exposure to actinic radiation after the developing operation to harden the resist after development or improve photoresist pattern contrast. In some embodiments, the second exposure is performed at a different wavelength than the first exposure. In some embodiments, the second exposure is at a wavelength less than 250 nm, and is performed by at least one of a KrF laser, an ArF laser, EUV, or electron beam.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

Resist underlayers of the present disclosure undergo a dehydration reaction upon exposure to actinic radiation and post-exposure baking. As a result, the molecular weight of the polymer in the underlayer composition decreases. The solubility of the polymer in alcohol decreases in alcohol-based solvent decreases after exposure and post-exposure baking. The water content of underlayer composition increases in some embodiments, as indicated by dry $CoCl_2$ paper and dry $CuSO_4$ paper analyses. In addition, in embodiments where the target group includes a diol, NMR, IR, and Raman analyses show an intensity decrease of the polymer OH groups and an intensity increase of polymer C═O groups after exposure and post-exposure baking.

Comparing a resist underlayer composition of the present disclosure with target groups having diol groups to a polyhydroxystyrene (PHS) underlayer composition not according to the present disclosure, after exposure to actinic radiation and post-exposure baking, the polyhydroxystyrene-based underlayer has no change polymer mass; pH value; NMR, IR, and Raman spectra of OH and C═O groups; time-of-flight secondary ion mass spectrometry (TOF-SIMS); water contact angle; thickness; and thermogravimetric analysis (TGA) (exposure to actinic radiation only). On the other hand, resist underlayer compositions according to the present disclosure show polymer mass loss (e.g.—water loss); more acidic or basic pH; NMR, IR, and Raman polymer OH group intensity decrease and polymer C═O intensity increase; oxygen % decrease in TOF-SIMS; increase in water contact angle; thickness shrinkage; and TGA weight loss (exposure to actinic radiation only).

In a comparison of a metal photoresist overlying the resist underlayer before and after exposure to actinic radiation and post-exposure baking, photoresists formed over an underlayer formed of a polymer compositions according to an embodiment of the present disclosure having target groups containing a diol group and an underlayer formed of a polyhydroxystyrene not according to an embodiment of the disclosure, the photoresist formed over an underlayer according to the present disclosure have a number of improved properties. For example, photoresists formed over underlayers according to the present disclosure have increased density; increased moisture content; increased metal-oxygen bond ratio; decreased TOF-SIMS carbon ratio; NMR, IR, and Raman metal-OH group and metal-O bond intensity increase. Furthermore, after patterning the photoresist films by development, the photoresist patterns formed over underlayers according to an embodiment of the disclosure have an increased photoresist contrast curve, require a much lower photoresist exposure dose, stronger photoresist mechanical line strength, larger peeling window, and increased throughput compared to patterned photoresist formed over polyhydroxystyrene underlayers not formed according to embodiments of the present disclosure.

Embodiments of the present disclosure allow reduced exposure dose required for the photoresist layer while improving line width roughness, increased peeling window, and reducing scum. For example, a 30 nm thick resist underlayer containing a polymer with diol target groups allows about an 11% reduction in photoresist exposure dose than an underlayer made of a polyhydroxystyrene polymer without the disclosed target groups and chemical reporter molecules. Meanwhile when the photoresist layer is exposed at the 11% reduced exposure dose, the use of the underlayers according to the present disclosure also provide about a 3% improvement in line width roughness, about a 9% improvement in the peeling window, and about a 4% reduction in scum. Thicker resist underlayers provide a greater amount of small molecules to the photoresist layer, however, thinner resist underlayers, such as a 5 nm thick underlayer made of a polymer composition according to the present disclosure having a diol-containing target group provide about a 9% improvement in peeling window compared to a 30 nm thick resist underlayer made from a polyhydroxystyrene not according to embodiments of the disclosure. In addition, the 5 nm thick underlayer also provides about a 1% improvement in line width roughness and scum reduction.

The novel underlayer compositions and semiconductor device manufacturing methods according to the present disclosure provide higher semiconductor device feature resolution and density at higher wafer exposure throughput with reduced defects in a higher efficiency process than conventional exposure techniques. Embodiments of the disclosure provide improved adhesion of the photoresist pattern to the substrate thereby preventing pattern collapse while preventing pattern scum. Embodiments of this disclosure provide improved integrity of the photoresist pattern, decreased line width roughness, decreased line edge roughness, and scum reduction. Embodiments of the disclosure allow reduced exposure doses and provide increased semiconductor device yield.

An embodiment of the disclosure is a method of manufacturing a semiconductor device including forming a photoresist underlayer over a semiconductor substrate. The photoresist underlayer includes a polymer, including a main polymer chain having pendant target groups, and pendant organic groups or pendant photoacid generator groups. The main polymer chain is selected from the group consisting of a polystyrene, a polyhydroxystyrene, a polyacrylate, a polymethylacrylate, a polymethylmethacrylate, a polyacrylic acid, a polyvinyl ester, a polymaleic ester, a poly(methacrylonitrile), and a poly(methacrylamide). The pendant target groups are one or more selected from the group consisting of a substituted or unsubstituted: C2-C30 diol group, C1-C30 aldehyde group, and C3-C30 ketone group. The pendant organic groups are C3-C30 aliphatic or aromatic groups having at least one photosensitive functional group, and the pendant photoacid generator groups are C3-C50 substituted aliphatic or aromatic groups. A photoresist layer is formed over the photoresist underlayer. The photoresist layer is selectively exposed to actinic radiation. The selectively exposed photoresist layer is developed to form a photoresist pattern. In an embodiment, the main polymer chain includes the pendant organic group having at least one photosensitive group, and the photosensitive group is selected from the group consisting of an epoxy group, an azo group, an alkyl halide group, an imine group, an alkene group, an alkyne group, a peroxide group, and combinations thereof. In an embodiment, the main polymer chain includes the pendant photoacid generator group, and the photoacid generator group is selected from the group consisting of onium salts, sulfonium salts, triphenylsulfonium triflate, triphenylsulfonium nonaflate, dimethylsulfonium triflate, iodonium salts, diphenyliodonium nonaflate, norbornene dicarboximidyl nonaflate, halogenated triazines, diazonium salts, aromatic diazonium salts, phosphonium salts, imide sulfonates, oxime sulfonates, diazodisulfones, disulfones, o-nitrobenzylsulfonates, sulfonated esters, halogenated sulfonyloxy dicarboximides, α-cyanooxyamine-sulfonates, ketodiazosulfones, sulfonyldiazoesters, 1,2-di(arylsulfonyl) hydrazines, nitrobenzyl esters, and s-triazines. In an embodiment, the photoresist underlayer further comprises a photobase generator. In an embodiment, the photoresist underlayer further comprises a photoacid generator compound. In an embodiment, the photoresist underlayer further comprises a thermal acid generator. In an embodiment, the pendant target groups are substituted with one or more selected from the group consisting of —F, —Cl, —Br, —I, —$NH_2$, —OH, —SH, —$N_3$, a sulfonyl group, an alkene group, an alkyne group, an imine group, an ether group, an ester group, a peroxide group, an amide group, a sulfone group, a carboxyl group, a carbonyl group, an allene group, an amine group, a phosphine group, a triol group, an aniline group, a pyridine group, a pyrrole group, a cyanide group, a phosphite group, and combinations thereof. In an embodiment, the method includes heating the photoresist underlayer at a temperature ranging from 150° C. to 250° C. before forming the photoresist layer. In an embodiment, the method includes heating the selectively exposed photoresist layer and photoresist underlayer at a temperature ranging from 50° C. to 160° C. before the developing the selectively exposed photoresist layer.

Another embodiment of the disclosure is a method of manufacturing a semiconductor device includes forming a photoresist underlayer over a semiconductor substrate. The photoresist underlayer includes a polymer having pendant target groups. A photoresist layer is formed over the underlayer. The photoresist layer and photoresist underlayer are selectively exposed to actinic radiation. A chemical reporter molecule is generated in the photoresist underlayer in portions of the photoresist underlayer exposed to the actinic radiation. The chemical reporter molecule is one or more selected from the group consisting of an electron, $O_2$, water, $H^+$, $OH^-$, a cation, an anion, and a C1-C10 group substituted with a functional group. The functional group is one or more selected from the group consisting of —F, —Cl, —Br, —I, —$NH_2$, —COOH, —OH, —SH, —$N_3$, —S(═O)—, an alkene group, an alkyne group, a imine group, an ether group, an ester group, an aldehyde group, a ketone group, an amide group, a sulfone group, an alkylcarboxyl group, a cyanide group, a allene group, an alkyl alcohol group, an amine group, a phosphine group, a phosphite group, an aniline group, a pyridine group, and a pyrrole group. A small molecule is generated by an interaction between the chemical reporter molecule and the target group in the portions of the photoresist underlayer exposed to actinic radiation. The small molecule is one or more selected from the group consisting of an electron, $O_2$, water, $H^+$, $OH^-$, a cation, an anion, and a C1-C10 group substituted with a functional group, wherein the functional group is one or more selected from the group consisting of —F, —Cl, —Br, —I, —$NH_2$, —COOH, —OH, —SH, —$N_3$, —S(═O)—, an alkene group, an alkyne group, a imine group, an ether group, an ester group, an aldehyde group, a ketone group, an amide group, a sulfone group, an alkylcarboxyl group, a cyanide group, an allene group, an alkyl alcohol group, an amine group, a phosphine group, a phosphite group, an aniline group, a pyridine group, and a pyrrole group. The small molecule is diffused from the photoresist underlayer to portions of the photoresist layer exposed to actinic radiation. The selectively exposed photoresist layer is developed to form a patterned photoresist layer. In an embodiment, the method includes heating the photoresist underlayer at a temperature ranging from 150° C. to 250° C. before forming the photoresist layer. In an embodiment, the diffusing the small molecule includes heating the selectively exposed photoresist layer and photoresist underlayer at a temperature ranging from 50° C. to 200° C. before the developing the selectively exposed photoresist layer. In an embodiment, the photoresist layer includes an organometallic material. In an embodiment, the actinic radiation is extreme ultraviolet radiation. In an embodiment, the small molecule and the chemical reporter molecule are different.

Another embodiment of the disclosure is a composition, including a polymer, including a main polymer chain having pendant target groups, and pendant organic groups or pendant photoacid generator groups. The main polymer chain is selected from the group consisting of a polystyrene, a polyhydroxystyrene, a polyacrylate, a polymethylacrylate, a polymethylmethacrylate, a polyacrylic acid, a polyvinyl ester, a polymaleic ester, a poly(methacrylonitrile), and poly(methacrylamide). The pendant target groups are one or more selected from the group consisting of a substituted or unsubstituted: C2-C30 diol group, C1-C30 aldehyde group, and a C3-C30 ketone group, wherein the pendant organic groups are C3-C30 aliphatic or aromatic groups having at least one photosensitive functional group, and wherein the pendant photoacid generator groups are C3-C50 substituted aliphatic or aromatic groups. In an embodiment, the polymer includes the pendant organic groups having at least one photosensitive group, and the photosensitive group is selected from the group consisting of an epoxy group, an azo group, an alkyl halide group, an imine group, an alkene group, an alkyne group, a peroxide group, and combinations thereof. In an embodiment, the polymer includes the pendant photoacid generator groups, and the photoacid generator groups are selected from the group consisting of onium salts, sulfonium salts, triphenylsulfonium triflate, triphenylsulfonium nonaflate, dimethylsulfonium triflate, iodonium salts, diphenyliodonium nonaflate, norbornene dicarboximidyl nonaflate, halogenated triazines, diazonium salts, aromatic diazonium salts, phosphonium salts, imide sulfonates, oxime sulfonates, diazodisulfones, disulfones, o-nitrobenzylsulfonates, sulfonated esters, halogenated sulfonyloxy dicarboximides, α-cyanooxyamine-sulfonates, ketodiazosulfones, sulfonyldiazoesters, 1,2-di(arylsulfonyl)hydrazines, nitrobenzyl esters, and s-triazines. In an embodiment, the composition includes a photobase generator. In an embodiment, the composition includes a photoacid generator compound. In an embodiment, the composition includes a thermal acid generator. In an embodiment, the composition includes a solvent. In an embodiment, the composition includes a surfactant. In an embodiment, the pendant target groups are substituted with one or more selected from the group consisting of —F, —Cl, —Br, —I, —$NH_2$, —OH, —SH, —$N_3$, a sulfonyl group, an alkene group, an alkyne group, an imine group, an ether group, an ester group, a peroxide group, an amide group, a sulfone group, a carboxyl group, a carbonyl group, an allene group, an amine group, a phosphine group, a triol group, an aniline group, a pyridine group, a pyrrole group, a cyanide group, a phosphite group, and combinations thereof. In an embodiment, the polymer includes the pendant organic groups, and the pendant organic groups include an aromatic group selected from the group consisting of a substituted or unsubstituted: phenyl group, naphthalenyl group, phenanthrenyl group, anthracenyl group, and phenalenyl group, and combinations thereof. In an embodiment, the composition includes a crosslinker. In an embodiment, the crosslinker is bound to the polymer.

Another embodiment of the disclosure is a method of manufacturing a semiconductor device, including forming a first layer over a semiconductor substrate. The first layer includes a polymer, including a main polymer chain having pendant target groups, and pendant organic groups or pendant photoacid generator groups. The pendant target groups are one or more selected from the group consisting of a substituted or unsubstituted: C2-C30 diol group, C1-C30 aldehyde group, and C3-C30 ketone group. A resist layer is formed over the first layer. Water is generated in first portions of first layer. The water in the first portions of the first layer is diffused into corresponding first portions of the resist layer. Second portions of the resist layer are removed, wherein the second portions of the resist layer are different from the first portions of the resist layer. First portions of the resist layer remain after the removing the second portions of the resist layer. In an embodiment, the method includes heating the first layer at a temperature ranging from 150° C. to 250° C. before forming the resist layer. In an embodiment, generating water in first portions of first layer includes exposing the first portions of the first layer to extreme ultraviolet radiation. In an embodiment, the diffusing the water includes heating the first layer and the resist layer at a temperature ranging from 50° C. to 200° C. before the removing the second portions of the resist layer. In an embodiment, the method includes heating the resist layer and the first layer at temperature ranging from 40° C. to 150° C. before the generating water in first portions of the first layer. In an embodiment, the resist layer includes an organometallic material. In an embodiment, the method includes removing second portions of the first layer, wherein the second portions of the first layer correspond to the second portions of the resist layer. In an embodiment, the method includes removing portions of the semiconductor substrate corresponding to the second portions of the first layer and the second portions of the resist layer. In an embodiment, a target layer is located between the semiconductor substrate and the first layer, and further comprising removing portions of the target layer corresponding to the second portions of the first layer and the second portions of the resist layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A composition, comprising:

a polymer, comprising:

a polyvinyl ester main polymer chain having pendant target groups and pendant organic groups, or pendant target groups and pendant photoacid generator groups, wherein the pendant target groups are one or more selected from the group consisting of a substituted or unsubstituted: C2-C30 diol group, C1-C30 aldehyde group, and C3-C30 ketone group, wherein the pendant organic groups are C3-C30 aliphatic or aromatic groups having at least one photosensitive functional group, and wherein the pendant photoacid generator groups are C3-C50 substituted aliphatic or aromatic groups.

2. The composition of claim 1, wherein the polymer includes the pendant organic groups having at least one photosensitive group, and the photosensitive group is selected from the group consisting of an epoxy group, an azo group, an alkyl halide group, an imine group, an alkene group, an alkyne group, a peroxide group, and combinations thereof.

3. The composition of claim 1, wherein the polymer includes the pendant photoacid generator groups, and the photoacid generator groups are selected from the group consisting of onium salts, sulfonium salts, triphenylsulfonium triflate, triphenylsulfonium nonaflate, dimethylsulfonium triflate, iodonium salts, diphenyliodonium nonaflate, norbornene dicarboximidyl nonaflate, halogenated triazines, diazonium salts, aromatic diazonium salts, phosphonium salts, imide sulfonates, oxime sulfonates, diazodisulfones, disulfones, o-nitrobenzylsulfonates, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and s-triazines.

4. The composition of claim 1, further comprising a photobase generator.

5. The composition of claim 1, further comprising a photoacid generator compound.

6. The composition of claim 1, further comprising a thermal acid generator.

7. The composition of claim 1, further comprising a solvent.

8. The composition of claim 1, further comprising a surfactant.

9. The composition of claim 1, wherein the pendant target groups are substituted with one or more selected from the group consisting of —F, —C, —Br, —I, $—NH_2$, —OH, —SH, $—N_3$, a sulfonyl group, an alkene group, an alkyne group, an imine group, an ether group, an ester group, a peroxide group, an amide group, a sulfone group, a carboxyl group, a carbonyl group, an allene group, an amine group, a phosphine group, a triol group, an aniline group, a pyridine group, a pyrrole group, a cyanide group, a phosphite group, and combinations thereof.

10. The composition of claim 1, wherein the polymer includes the pendant organic groups, and the pendant organic groups include an aromatic group selected from the group consisting of a substituted or unsubstituted: phenyl group, naphthalenyl group, phenanthrenyl group, anthracenyl group, and phenalenyl group, and combinations thereof.

11. The composition of claim 1, wherein the composition further comprises a crosslinker.

12. The composition of claim 11, wherein the crosslinker is bound to the polymer.

13. A polymer composition, comprising:

a polyvinyl ester main polymer chain, wherein:

the main polymer chain includes one or more pendant target groups, wherein the pendant target groups are substituted with one or more selected from the group consisting of —F, —Cl, —Br, —I, $—NH_2$, —OH, —SH, $—N_3$, a sulfonyl group, an alkene group, an alkyne group, an imine group, an ether group, an ester group, a peroxide group, an amide group, a sulfone group, a carboxyl group, a carbonyl group, an allene group, an amine group, a phosphine group, a triol group, an aniline group, a pyridine group, a pyrrole group, a cyanide group, a phosphite group, and combinations thereof, and the main polymer chain includes pendant organic groups, wherein the pendant organic groups include an aromatic group selected from the group consisting of a substituted or unsubstituted: phenyl group, naphthalenyl group, phenanthrenyl group, anthracenyl group, and phenalenyl group, and combinations thereof; and a photoacid generator compound in a concentration ranging from about 0.1 wt. % to 20 wt. % relative to a total weight of the polymer composition.

14. The polymer composition according to claim 13, further comprising a solvent.

15. The polymer composition of claim 13, further comprising a surfactant.

16. The polymer composition according to claim 13, wherein the pendant organic groups have at least one photosensitive group, and the photosensitive group is selected from the group consisting of an epoxy group, an azo group, an alkyl halide group, an imine group, an alkene group, an alkyne group, a peroxide group, and combinations thereof.

17. A polymer composition, comprising:

a polyvinyl ester main polymer chain, wherein:

the main polymer chain includes one or more pendant target groups selected from the group consisting of a substituted or unsubstituted: C2-C30 diol group, C1-C30 aldehyde group, and C3-C30 ketone group, the main polymer chain includes pendant organic groups selected from C3-C30 aliphatic or aromatic groups having at least one photosensitive functional group, and the main polymer chain includes pendant photoacid generator groups selected from C3-C50 substituted aliphatic or aromatic groups;

a thermal acid generator;

a crosslinker; and a surfactant.

18. The polymer composition according to claim 17, wherein the photosensitive functional group is selected from the group consisting of an epoxy group, an azo group, an alkyl halide group, an imine group, an alkene group, an alkyne group, a peroxide group, and combinations thereof.

19. The polymer composition according to claim 17, wherein the pendant target groups are substituted with one or more selected from the group consisting of —F, —Cl, —Br, —I, —$NH_2$, —OH, —SH, —$N_3$, a sulfonyl group, an alkene group, an alkyne group, an imine group, an ether group, an ester group, a peroxide group, an amide group, a sulfone group, a carboxyl group, a carbonyl group, an allene group, an amine group, a phosphine group, a triol group, an aniline group, a pyridine group, a pyrrole group, a cyanide group, a phosphite group, and combinations thereof.

20. The polymer composition according to claim 17, wherein the thermal acid generator is in a concentration ranging from about 0.1 wt. % to 20 wt. % relative to a total weight of the polymer composition.

* * * * *